US007224303B2

(12) United States Patent
Kwon

(10) Patent No.: US 7,224,303 B2
(45) Date of Patent: May 29, 2007

(54) DATA DRIVING APPARATUS IN A CURRENT DRIVING TYPE DISPLAY DEVICE

(75) Inventor: Oh-Kyong Kwon, Suwon-Si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/229,117

(22) Filed: Sep. 15, 2005

(65) Prior Publication Data

US 2006/0077077 A1 Apr. 13, 2006

(30) Foreign Application Priority Data

Oct. 8, 2004 (KR) ...................... 10-2004-0080386

(51) Int. Cl.
*H03M 1/66* (2006.01)

(52) U.S. Cl. ...................................... 341/144; 341/145

(58) Field of Classification Search ................ 341/144, 341/143, 145
See application file for complete search history.

(56) References Cited

U.S. PATENT DOCUMENTS

2006/0061499 A1* 3/2006 Seo ............................ 341/144
2006/0077137 A1 4/2006 Kwon

FOREIGN PATENT DOCUMENTS

KR 10-2006-0031382 4/2006

* cited by examiner

*Primary Examiner*—Rexford Barnie
*Assistant Examiner*—Joseph Lauture
(74) *Attorney, Agent, or Firm*—Christie, Parker & Hale, LLP

(57) ABSTRACT

The present invention relates to a data driving apparatus for driving a current driving display device. A current output device of the data driving apparatus sequentially applies data signals to data lines. The data signals correspond to analog converted output currents. The current output device may include an analog output current converter for converting the analog converted output currents to analog output currents including a main signal and a sub-signal having a predetermined ratio therebetween, a switch for supplying the analog output currents including the main signal and the sub-signal according to a first control signal, and a current sample/hold circuit for sampling or holding the analog output currents including the main signal and the sub-signal according to a current sample/hold control signal.

19 Claims, 20 Drawing Sheets

DATA DRIVING APPARATUS IN A CURRENT DRIVING TYPE DISPLAY DEVICE

CROSS-REFERENCE TO RELATED APPLICATION

This application claims priority to and the benefit of Korean Patent Application No. 10-2004-0080386 filed in the Korean Intellectual Property Office on Oct. 08, 2004, the entire content of which is incorporated herein by reference.

FIELD OF THE INVENTION

The present invention relates to a data driver of a current driving type display device. More specifically, the present invention relates to a data driver for driving a current driving type display device in an organic light emitting diode (OLED) display.

BACKGROUND OF THE INVENTION

Generally, in an organic light emitting diode (OLED) display, phosphorus organic materials are disposed in pixels arranged in a matrix format, and an image is formed by controlling the amount of a current flowing to the phosphorous materials.

Such an OLED display is an advanced display having low power consumption, a wide viewing angle, and high responsiveness. Thus the OLED display is expected to be the next-generation display because the OLED display is superior to a liquid crystal display which has been one of the most widely commercialized flat panel displays.

In further detail, the OLED display excites phosphorus organic materials, and forms an image by voltage-programming or current-programming N×M organic light emitting cells. The organic light emitting cell includes an indium tin oxide (ITO) pixel electrode, an organic thin film, and a metal layer. The organic thin film has a multi-layered structure including an emission layer (EML), an electron transport layer (ETL), and a hole transport layer (HTL), so as to balance electrons and holes and thereby enhance efficiency of light emission. Further, the organic thin film may separately includes an electron injection layer (EIL) and a hole injection layer (HIL).

According to methods of driving the organic light emitting cells having the above configuration, the OLED display is grouped into a passive matrix OLED (PMOLED) and an active matrix OLED (AMOLED). Until now, portable devices have been mostly produced by installing the PMOLED in sub-displays of the portable devices. However, it is difficult to apply the PMOLED to a wide panel with high resolution, because the PMOLED shows early degradation of organic light emitting materials and high power consumption due to its high driving current.

Therefore, the AMOLED scheme is more suitable for manufacturing and driving a wide OLED display with high resolution. Methods for driving the AMOELD are classified into a voltage programming method that programs a voltage signal to a panel to form a desired image and a current programming method that programs a current signal to the panel to form the desired image.

The voltage programming method has the feature of using a data driving integrated circuit (IC) used for driving a thin film transistor-liquid crystal display (TFT-LCD), or a modified data driving IC. However, because a polysilicon TFT used in the AMOELD manufacturing process has a large variation in threshold voltage and mobility due to non-uniform grain size and trap density, image quality of the voltage programming AMOELD display may be non-uniform.

To solve this problem, various voltage programming pixel types for compensating for the variation in the threshold voltage have been proposed, but the non-uniformity of the mobility still remains a problem to be solved.

In the current programming method, however, uniform display characteristics are achieved even if driving transistors in each pixel have non-uniform voltage-current characteristics, provided that a current source for supplying the current to the pixels is uniform throughout the entire panel (i.e., at all the data lines). In other words, the current programming AMOLED solves the problems associated with the voltage programming devices, and it has been proved through published papers and demo panels that the current programming AMOLED corrects for the variations in the threshold voltage and mobility.

It is desirable to fabricate a pixel of the current programming type AMOLED to correct for non-uniformity in threshold voltages, mobility of carriers, and saturation currents of a driving TFT while providing full current programming within a predetermined period of time. In addition, for driving a current programming AMOELD panel, a data driving IC outputting a constant current is required to sufficiently drive a parasitic resistance and a parasitic capacitance of data lines of the panel while variation in output currents is small enough to prevent non-uniformity of image quality. Such capabilities in the current driving type AMOLED display pixels may be achieved by a current mirror type pixel or a current source type pixel. The current mirror type pixel structure adopted by Sony uses two TFTs as a current mirror. Assuming that there is no variation in the threshold voltage and mobility, a width ratio of the two TFTs is set to be M:1. When M is greater than 1, program currents $I_{IN}$ are much greater than emission currents of the pixel. In this case, the current programming may be performed within a predetermined line time but uniformity of image quality may not be guaranteed. Further, it is impracticable to achieve no variation between all the pixels in the threshold voltage and mobility of the two TFTs in which the width ratio of the two TFTs is set to be M:1.

In addition, a data driver of the OLED display employing the current programming method requires a current mode digital to analog converter (DAC) because a DAC outputs a current. However, a conventional current mode DAC occupies a wide area, and thus, it is difficult to provide the DAC for each output data line.

The above information disclosed in this Background of the Invention section is only for enhancement of understanding of the invention and therefore, it should not be assumed that all the above information forms the prior art that is already known in this country to a person or ordinary skill in the art.

SUMMARY OF THE INVENTION

The present invention provides a data driving apparatus having advantages of high performance for separating currents while providing uniform output currents, high resolution grayscales, and high quality images.

According to an embodiment of the present invention, an exemplary current output device of a data driving apparatus sequentially applying data signals to data lines, the data signals corresponding to analog converted output currents, includes an analog output current converter, a switch, and a current sample/hold circuit. The analog output current converter converts the analog converted output currents to analog output currents including a main signal and a sub-signal, the main signal having a predetermined ratio with the sub-signal. The switch supplies the analog output currents including the main signal and the sub-signal according to a first control signal. The current sample/hold circuit samples or holds the analog output currents including the main signal and the sub-signal according to a current sample/hold control signal.

The analog output currents including the main signal and sub-signal have a predetermined ratio between the two signals such that a load condition may be constant and a conversion speed of the analog converted output current is not reduced.

The current sample/hold circuit includes a master current sample/hold circuit for sampling or holding the analog output current according to a first current sample/hold control signal, a slave current sample/hold circuit for holding or sampling the analog output current according to a second current sample/hold control signal, and a multiplexer for selecting the output current held in the master current sample/hold circuit or the slave current sample/hold circuit according to a current output control signal and applying the selected output current to a corresponding data line.

The first and second current sample/hold control signals are mutually exclusively supplied such that a sampling operation may not be concurrently performed in the master and slave current sample/hold circuits.

One of the master and slave current sample/hold circuits holds a current value sampled for a previous row line time when the other of the master and slave current sample/hold circuits samples the analog output current.

The currents outputted from the master and slave current sample/hold circuits are selectively outputted according to the current output control signal after being amplified to an integer multiple of the control signal.

The master or slave current sample/hold circuit includes a two bit digital/analog converter for controlling an output current range such that the output current range is proportionally reduced within a maximum output current range.

The current sample/hold circuit further includes an additional current supplier for supplying the analog output current to the master and slave current sample/hold circuits after adding a predetermined direct current to the analog output current.

The current sample/hold circuit further includes a subtractor for subtracting the direct current added by the additional current supplier from the current outputted from the multiplexer. The switch selects one of a plurality of current output devices.

In a further embodiment, a data driving apparatus for applying data signals to a plurality of data lines of a display panel includes a multiplexer sequentially selecting and outputting a plurality of data signals, a digital/analog converter DAC sequentially converting a plurality of data signals sequentially transmitted from the multiplexer into analog data signals, and a current output unit applying the data signals converted by the DAC to the respective data lines.

The current output unit includes an analog output current converter for inputting the analog output currents as analog output currents including a main signal and a sub-signal having a predetermined ratio therebetween, a switch for supplying the analog output currents according to a first control signal, and a current sample/hold circuit for sampling or holding the analog output currents according to a current sample/hold control signal.

In another embodiment, a light emitting display device includes a display unit having a plurality of scan lines transmitting selection signals, a plurality of data lines transmitting data signals, a plurality of pixels coupled to the plurality of data lines and the plurality of scan lines, a data driver generating the data signals and applying the generated data signals to the respective data lines, and a scan driver generating the selection signals and applying the generated selection signals to the respective scan lines.

The data driver includes a multiplexer sequentially selecting a plurality of data signals and outputting the sequentially selected data signals, a digital/analog converter (DAC) sequentially converting a plurality of data signals sequentially transmitted from the multiplexer into analog data signals, and a current output unit controlling the data signals converted by the DAC to be applied to the respective data lines.

The current output unit includes an analog output current converter for converting the analog converted output currents to analog output currents including a main signal and a sub-signal having a predetermined ratio therebetween, a switch for supplying the analog output currents including the main signal and the sub-signal according to a first control signal, and a current sample/hold circuit for sampling or holding the analog output currents including the main signal and the sub-signal according to a current sample/hold control signal.

In another embodiment, a light emitting display panel includes a plurality of scan lines for transmitting selection signals, a plurality of data lines for transmitting data currents, a plurality of pixels coupled to the scan lines and the data lines, a scan driver for generating the selection signals and applying the generated selection signals to the corresponding scan lines, and a data driver for sequentially converting a sequentially transmitted plurality of data signals into analog data signals, and for controlling a current output unit to sequentially apply the converted data signals to the data lines.

The current output unit of the data driver includes an analog output current converter for converting the analog converted output currents to analog output currents including a main signal and a sub-signal having a predetermined ratio therebetween, a switch for supplying the analog output currents including the main signal and the sub-signal according to a first control signal, and a current sample/hold circuit for sampling or holding the analog output currents including the main signal and the sub-signal according to a current sample/hold control signal.

DETAILED DESCRIPTION

Configuration and operation of a data driving apparatus of a current driving type display device according to embodiments of the present invention are described below in detail with reference to the accompanying drawings.

As is well known, a data driver of a flat panel display externally receives a video signal and converts it into a proper signal value for a display panel. Since a driving circuit of a current driving type data driver outputs currents, the current driving type data driver drives a current driving type display device which is capable of expressing gray-scales by controlling currents flowing to an organic light emitting diode (OLED).

Figure 1:
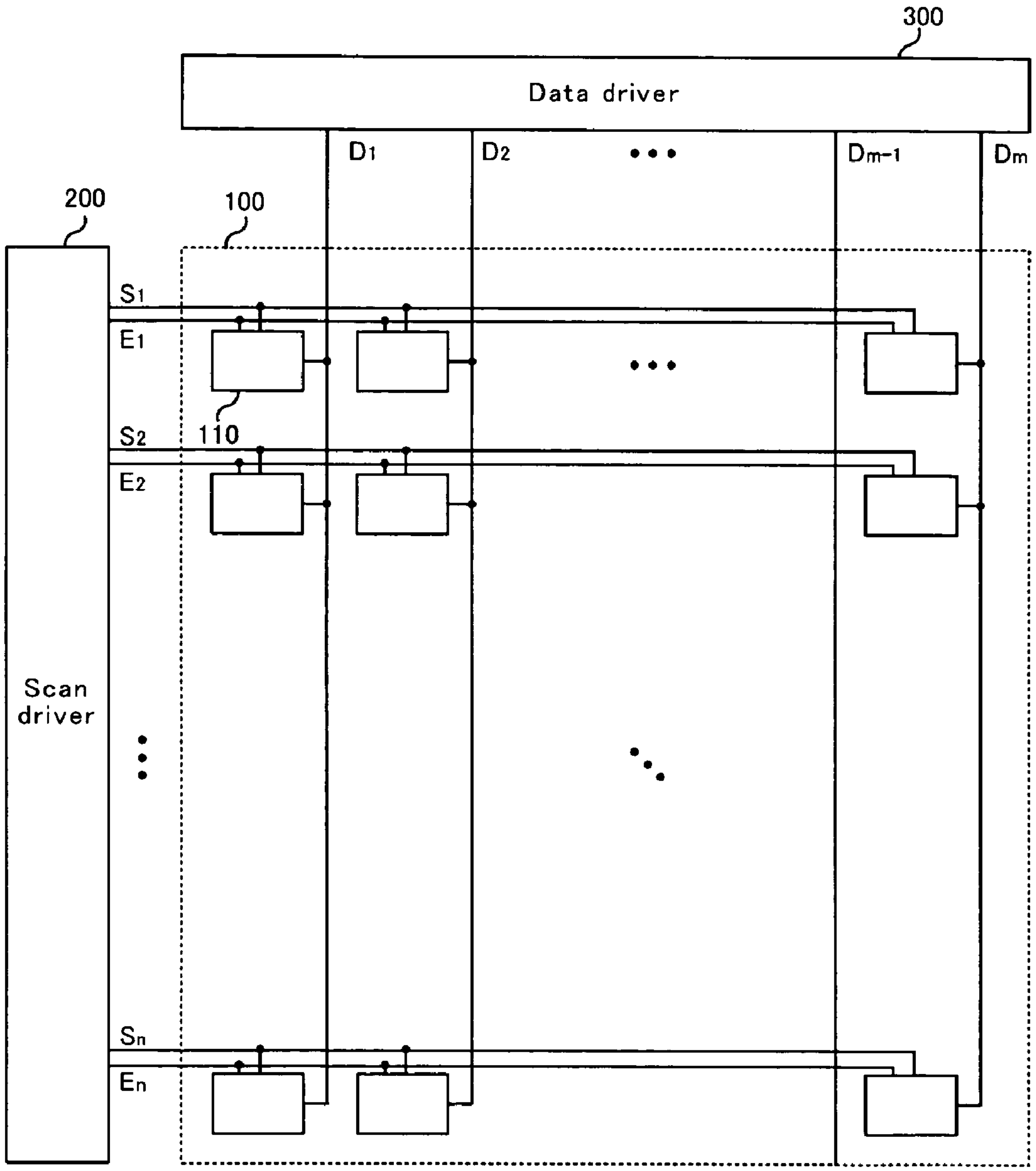
FIG. 1 schematically illustrates a configuration of a light emitting display device according to an embodiment of the present invention.
Figure 2:
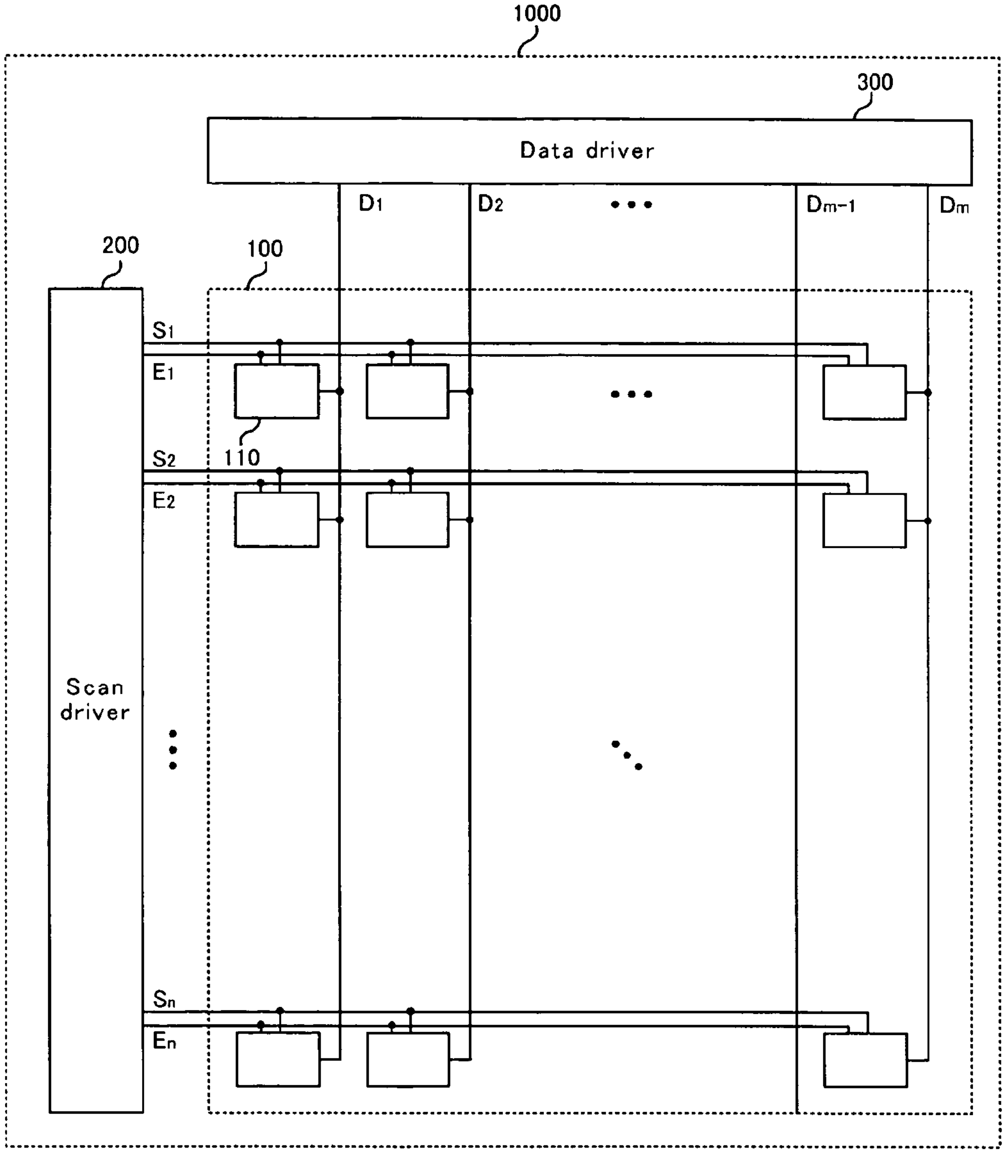
FIG. 2 illustrates a schematic configuration of a light emitting display device having a peripheral device mounted on a display panel of the device according to an embodiment of the present invention.

FIG. 1 schematically illustrates a configuration of a light emitting display device according to an embodiment of the present invention, and FIG. 2 illustrates a schematic configuration of a light emitting display device having a peripheral device mounted on a display panel of the device according to an embodiment of the present invention.

Referring to FIG. 1, a display unit 100, a scan driver 200, and a data driver 300 form the display panel of the present invention. Referring to FIG. 2, an OLED display includes a substrate 1000 for forming a display panel. The substrate 1000 includes the display unit 100 for visualizing an actual image and a peripheral part. The peripheral part includes the data driver 300 and the scan driver 200.

The display unit 100 includes a plurality of data lines D1-Dm, a plurality of selection scan lines S1-Sn, a plurality of light emitting scan lines E1-En, and a plurality of pixels 110. The plurality of data lines D1-Dn extend in a column direction, and transmit data currents for forming an image to the pixels 110. The selection scan lines S1-Sm and the light emitting scan lines E1-En extend in a row direction, and respectively transmit selection signals and light emitting signals to the pixels 110. In addition, each pixel area is defined by one data line and one selection scan line.

The data driver 300 applies the data currents to the data lines D1-Dm. The scan driver 200 sequentially applies the selection signals to the plurality of selection scan lines S1-Sn. The scan driver 200 also sequentially applies the light emitting signals to the plurality of light emitting scan lines E1-En.

As shown in FIG. 2, the data driver 300 and/or the scan driver 200 may be mounted on the substrate 1000, as an integrated circuit. In addition, the drivers 200, 300 may be formed on the same layer of the substrate 1000 where the data lines D1-Dm, the scan lines S1-Sn, E1-En, and transistors of the pixel circuits are formed. Alternatively, the scan and data drivers 200, 300 may be formed on a substrate separate from the substrate 1000, and the separate substrate may be electrically coupled to the substrate 1000. The scan and data drivers 200, 300 may also be mounted as a chip on a tape carrier package (TCP), a flexible printed circuit (FPC), or a tape automatic bonding (TAB) attached and electrically coupled to the substrate 1000.

A data driver of a current driving type display device according to an embodiment of the present invention is described below in more detail.

After receiving K-bit digital video input signals corresponding to red, green, and blue colors, the data driver converts the received signals into current signals for driving an active matrix OLED (AMOLED) panel, and outputs the converted current signals. Accordingly, a circuit is required for converting a digital video signal into a proper analog current signal and outputting the analog current signal. These tasks are performed by an analog circuit part.

The analog circuit part converts the digital video signal into the analog current signal and outputs the analog current signal to the display panel of the AMOLED display. The analog circuit part and pixel structure of the panel are some of the main components that affect image quality. Further, for the purpose of driving a 15.5-inch wide panel with a wide extended graphics array (WXGA; 1280×RGB×768) resolution, several factors should be considered when designing circuits. For example, it is desirable to achieve uniformity of output currents between panels.

Figure 3A:
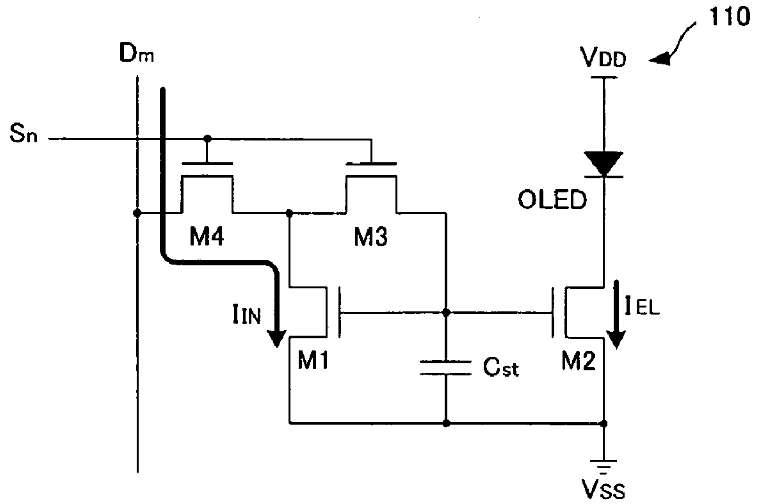
FIG. 3A and FIG. 3B exemplarily illustrate a current mirror type AMOLED pixel structure and a current programming type AMOLED pixel structure, respectively.
Figure 3B:
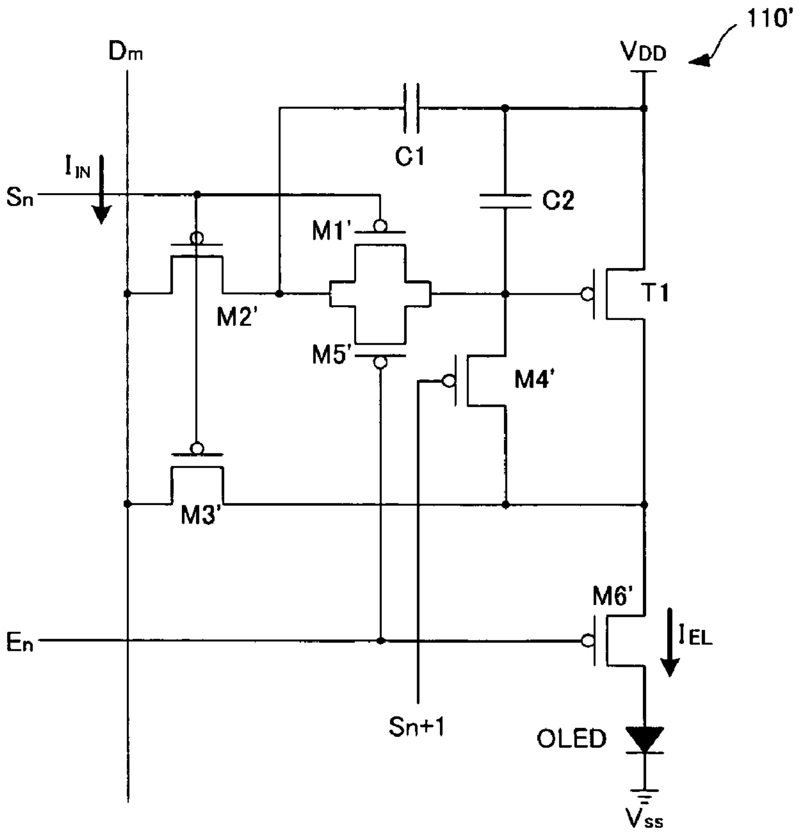
Figure 4A:
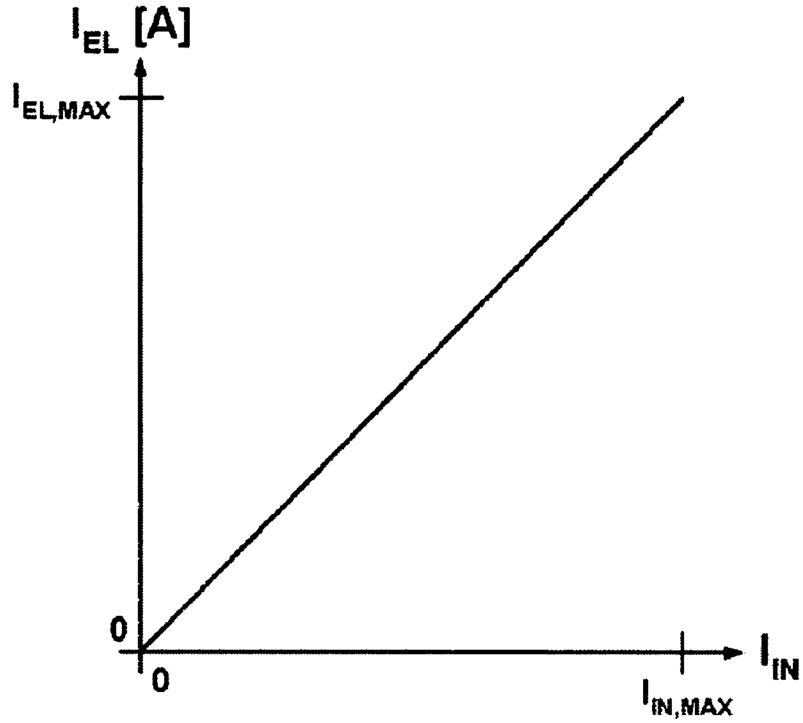
FIG. 4A and FIG. 4B respectively illustrate relationships between a program current and an output current of the AMOLED pixels of FIG. 3A and FIG. 3B.

FIG. 3A and FIG. 3B illustrate a current mirror type AMOLED pixel structure and a current programming type AMOLED pixel structure, respectively. FIG. 4A and FIG.

4B respectively illustrate relationships between a program current and an output current of the AMOLED pixels of FIG. 3A and FIG. 3B.

Referring to FIG. 3A, one example of the AMOLED pixel structures is shown that includes a current mirror. The pixel 110 of FIG. 3A includes transistors M1, M2, M3, and M4, a capacitor $C_{st}$, and an OLED that are coupled to a scan line Sn and a data line Dm. An output current $I_{IN}$ of the data driver is programmed to flow to the transistor M1, and an entering current $I_{EL}$ scaled by a width/length (W/L) ratio between the transistor M1 and the transistor M2 flows through the OLED such that the pixels 110 emit light. The current programming type AMOLED pixel 110' structure of FIG. 3B includes transistors M1', M2', M3', M4', M5', and M6', a capacitor $C_2$, and an OLED. This pixel 110' is coupled to two scan lines Sn and Sn+1, a data line Dm, and an emitting scan line En.

A panel is formed by arranging the pixels 110 in a matrix format. Assuming that electrical and optical characteristics of transistors and organic light emitting materials between different pixels 110 are set to be equivalent to each other, image quality of the panel is determined by uniformity of the program current $I_{IN}$ programmed to the pixels 110 from the data driving circuit. Generally, the number of output channels of one data driver is greater than 300. A deviation of relative output currents between the respective channels in a driving circuit IC should be minimized when the number of columns of the panel is greater than the number of the output channels of one data driver. Assuming that all the panels are appropriately and ideally manufactured, an absolute error of currents outputted from the respective driving circuit ICs should also be minimized in order to maintain a uniform image quality between the panels.

General utility of the data driving circuit may be increased by obtaining a wide range of output currents. The output currents of the data driver 300 relate closely to a pixel configuration.

When the entering current $I_{EL}$ flowing through the OLED and the program current $I_{IN}$ are related linearly (FIG. 4A), as is the case for the pixel 110 shown in FIG. 3A, the difference between grayscales of the program current $I_{IN}$ is constant. When a panel to be driven is small and has low resolution, the panel may be driven even if a ratio between the entering current $I_{EL}$ and the program current $I_{IN}$ is small. In this situation, a maximum value and a range of an output current of a data driving IC may be reduced.

Figure 4B:
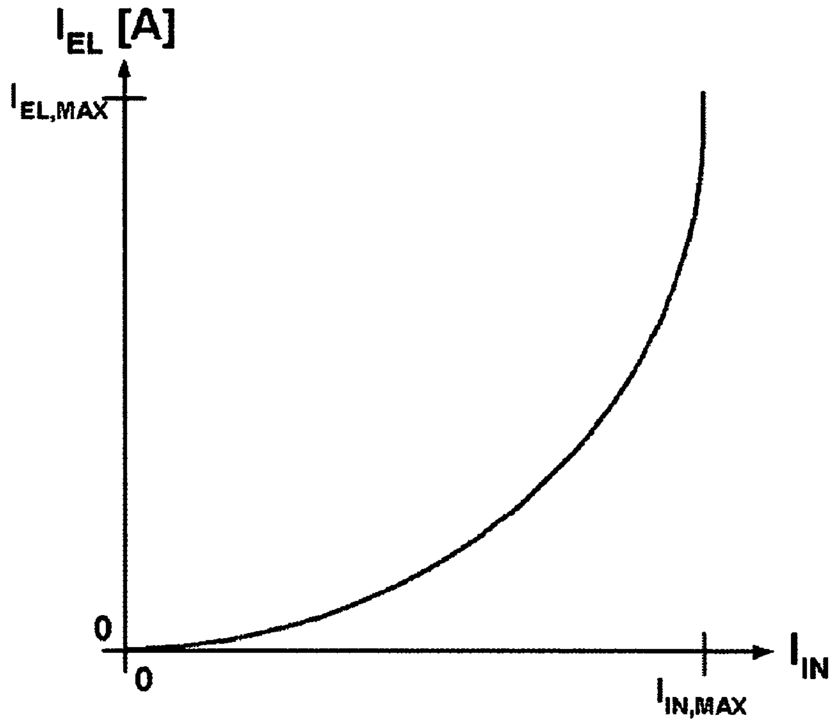

However, when the panel to be driven is a wide panel with high resolution, the required maximum value of the output currents of the data driving IC is large and the range of the output currents is also wide. A Pixel circuit for a different embodiment of the pixel 110 is shown in FIG. 3B as pixel 110'. In the pixel configuration 110' shown in FIG. 3B, the program current $I_{IN}$ is not linearly proportional to the entering current $I_{EL}$. Rather, the program current $I_{IN}$ is proportional to a square of the entering current $I_{EL}$ (FIG. 4B). In this case, the required range for the output current is further increased compared to the pixel configuration 110 shown in FIG. 3A. As described above, the required maximum output current value and output current range of the data driving IC depend on the area, resolution, and pixel configuration of the AMOLED panel to be driven. Accordingly, the utility of the data driving circuit in general may be increased by setting the maximum output current value at a high value and obtaining a wide output current range when the data driving circuit is manufactured.

Finally, a large number of output channels should be integrated in the data driving IC. In the case of a TFT-LCD data driving IC, a DAC and a buffer circuit are generally formed in one channel, and about 300 to 480 channels are usually integrated in one IC.

In a current driving type data driving IC, according to an embodiment of the present invention, the DAC outputs currents. In this case, a current mode DAC is used. In general, since the current mode DAC occupies large areas, it is impracticable to integrate the current mode DAC into every output channel. Accordingly, a demultiplexing function is required such that one DAC may be used for handling output currents of several channels, and a configuration of the data driving IC should be different from the configuration used for the conventional TFT-LCD.

An analog circuit configuration of a data driver 300 in a current driving type display device according to an embodiment of the present invention is described below.

Figure 5:
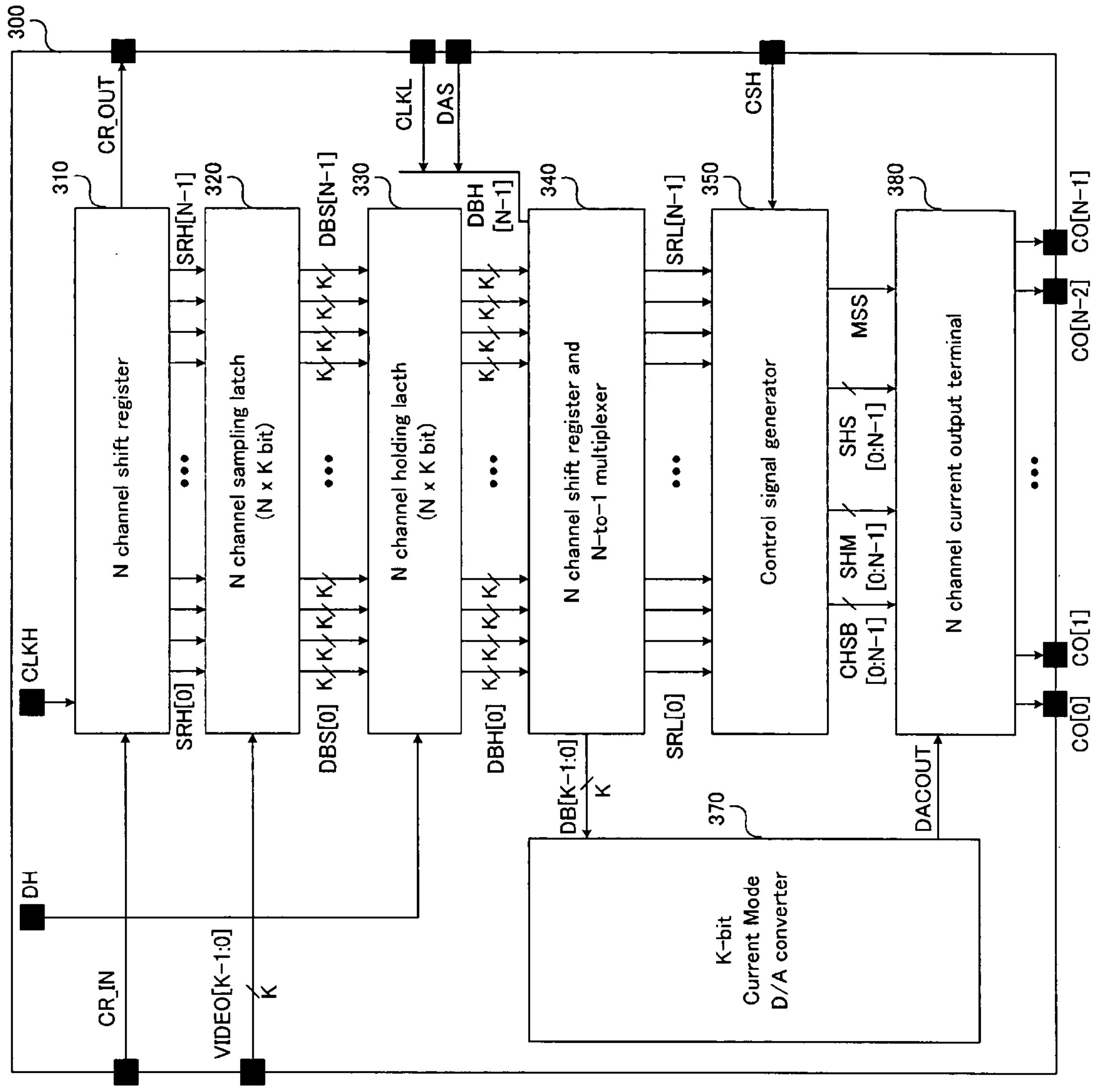
FIG. 5 shows a diagram of a configuration of the data driver of the current driving type display device according to an embodiment of the present invention.
Figure 6:
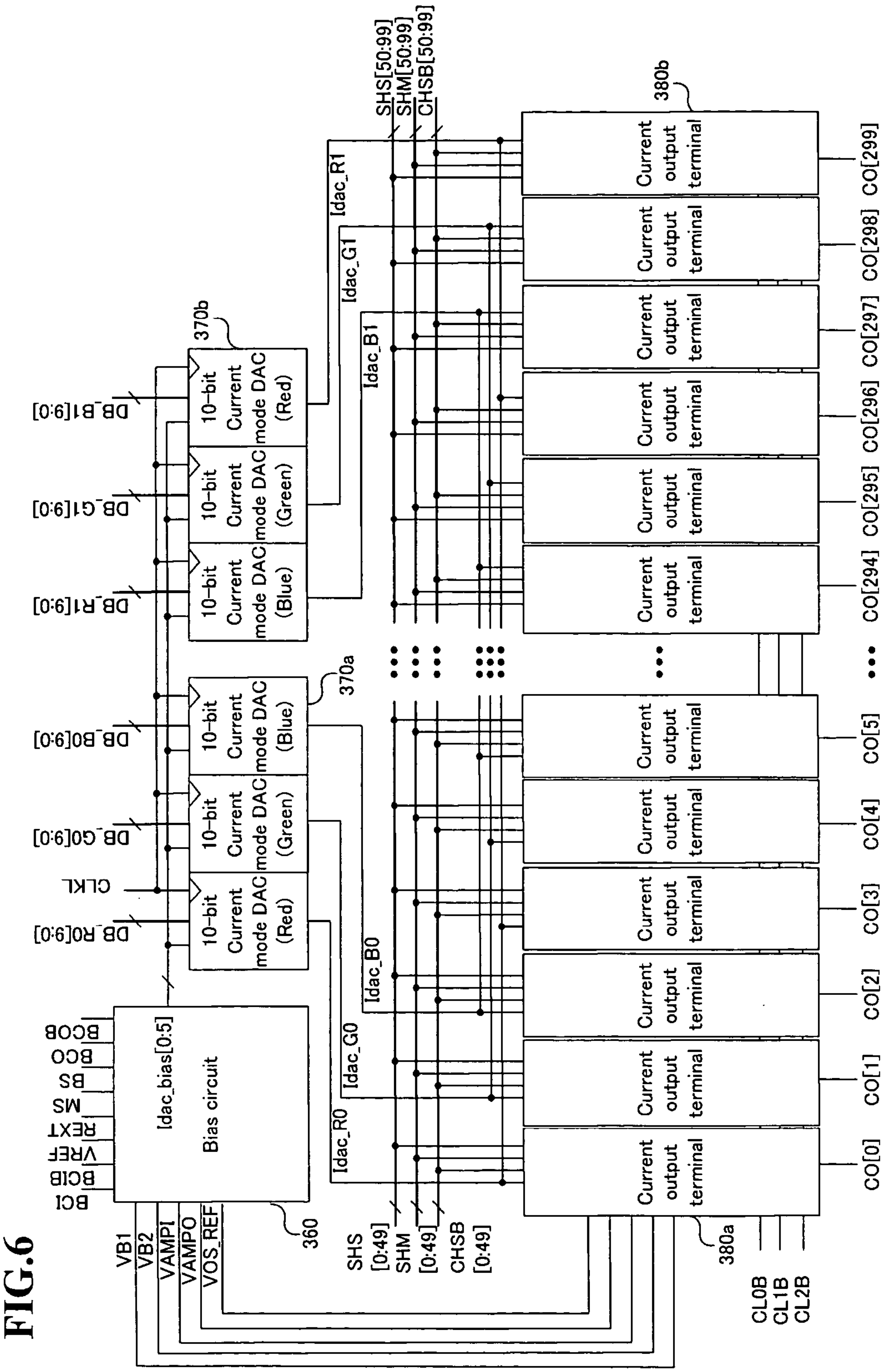
FIG. 6 shows a diagram of a configuration of an analog circuit part of the data driver shown in FIG. 5 in further detail.

FIG. 5 shows the data driver 300 of the current driving type display device according to an embodiment of the present invention, and FIG. 6 shows an analog circuit part of the data driver shown in FIG. 5 in further detail.

Referring to FIG. 5, according to the embodiments of the present invention, a circuit for sequentially storing K-bit digital video data VIDEO[K-1:0] in a data driving circuit includes an N channel shift register 310, an N channel sampling latch 320, and an N channel holding latch 330. The analog circuit part in the current mode data driver 300 is shown in FIG. 6 and includes a bias circuit 360, a current mode digital/analog (D/A) converters 370*a*, 370*b*, and a current output terminals 380*a*, 380*b*.

An N-channel shift register and N-to-1 multiplexer 340 driven by a low frequency clock signal (CLKL) sequentially transmits N-channel video data stored in the holding latch 330 to a K-bit current mode D/A converter, which is also called a current mode DAC 370. At this time, the N-channel shift register and N-to-1 multiplexer 340 transmits one piece of data corresponding to one data channel after another piece of data corresponding to another data channel.

The current mode DAC 370 with K-bit resolution, sequentially receives K-bit input data DB[K-1:0] from the holding latch 330 N times, and sequentially outputs currents corresponding to the input data.

An output current signal DACOUT from the DAC 370 is sequentially transmitted to an N channel current output terminal 380 to be stored therein. A control signal generator 350 selects a channel for receiving the DACOUT signal from the N channel current output terminal 380. After sequentially receiving and storing the DACOUT signal, the N channel current output terminal 380 outputs a current corresponding to the DACOUT signal to the display panel through the data lines D1-Dm.

According to this embodiment of the present invention, when the current driving type display panel is driven by using the data driver 300 only one DAC 370 is required in the driving circuit, and therefore a circuit area may effectively be reduced. In an embodiment, when a data driving circuit is formed in a limited area, resolution of the DAC 370 may be sufficiently increased in the data driver 300 and therefore high grayscale images may be displayed.

In addition, when a conventional multi-channel DAC is used, output current variation occurs between the conventional DACs, and therefore display quality may deteriorate. However, since the N channel current output terminal 380 is driven by using only one DAC 370 in the data driver 300, a high quality image may be displayed. Also, power consumption is greatly reduced since there is only one reference current source.

The data driving IC of the data driver 300 of the current driving type display device according to a further detailed embodiment of the present invention is described below.

Referring to FIG. 5 and FIG. 6, the current driving type display device includes a total of 300 output channels (100 output channels for each of the red R, green G, and blue B data). Input/output of digital signals are performed in a 5V complementary metal-oxide semiconductor (CMOS) compatible type IC.

In a further embodiment, the data driving IC of the data driver 300 receives 10-bit R, G, and B digital signals from a video controller, and the digital signals include signals DB_R[9:0], DB_G[9:0], and DB_B[9:0].

A line memory including sampling and holding latches 320; 330 in the data driving circuit stores the 10-bit R, G, and B digital signals received externally. Since the number of the output channels of the data driving IC is 300, the number of 10-bit holding latches is also 300. Further, the number of colors displayed by one data driving IC is 100 for each of the R, G, and B data because the 300 output channels store the R, G, and B data. At this time, the DAC 370 is required since the stored 10 bit video signals, having digital signal values, should be converted into appropriate analog current signal values. A current mode DAC configuration is adopted when designing the DAC 370 in order to enable the DAC 370 to output current signals.

Output current signals of the current mode DACs 370 are transmitted to the current output terminals of the respective channels and values of the transmitted currents are stored in the respective current output terminals. Output currents of the current output terminals finally drive the pixels 110, 110'. The bias circuit 360 controls the respective analog circuit parts by generating analog voltages and current signals of the current mode DAC 370 and the current output terminal 380.

For the purpose of increasing the general utility of the DAC 370, grayscales of the DAC 370 are 1024 grayscales rather than 256 grayscales, which relates to linear output characteristics of the current mode DAC 370. According to the embodiments of the present invention, displayed grayscales of the output current of the data driving IC are 8-bit 256 grayscales.

However, according to the pixel configuration 110, the output current $I_{EL}$ of the OLED may be linearly related to the program current as shown in FIG. 4A. On the contrary, the output current $I_{EL}$ may have non-linear characteristics as shown in FIG. 4B for the alternative pixel configuration 110'. Accordingly, for the purpose of expressing 256 grayscales in both of the pixel configurations having the linear current characteristics 110 and the non-linear current characteristics 110', the DAC 370 should be capable of controlling the non-linear current characteristics while being capable of separating 256 grayscales. Alternately, the DAC 370 should be capable of separating more than 256 grayscales while having linear current characteristics.

In general, most DACs, including the current mode DACs, have linear current characteristics. Accordingly, in one configuration, after designing the DAC with more than 256 grayscales, proper grayscales for pixel characteristics are selectively used. That is, after designing a DAC with 10-bit, 1024 grayscales, the DAC selects 256 proper grayscales for the pixel characteristics among 1024 grayscales and outputs the 256 selected grayscales. In this case, after finding grayscale characteristics of the pixel, selecting values corresponding to the 256 grayscales, and storing the values in a memory, a controller of the driving circuit transmits corresponding 10-bit video data values to the data driving IC by a digital signal process. In addition, since grayscale expression characteristics of the pixel vary according to the R, G, and B data, the controller forms look-up tables in memories for the respective R, G, and B data. For this configuration, a memory capacity of 7680-bits (256×10×3 bits) is required.

By using the applied 30-bit data, the 10-bit current mode DACs 370*a* and 370*b* are driven, and 8-bit grayscales among the 10-bit grayscales are selected to be outputted. The signals DB_R[9:0], DB_G[9:0], and DB_B[9:0] are sequentially latched and stored in the sampling latch 320 using sequential output signals SRH[0:99] generated in the 100-bit shift register 310 as clock signals for the respective channels. At this time, video signals serially applied in units of 30 bits are converted into parallel data DBS[0:299] by the sampling latch 320. The 300 channel data DBS[0:299] are transmitted to the holding latch 330 by a signal DH where their values are maintained while subsequent data are sampled.

The 300 channel data stored in the holding latch 330 are converted into analog current signals by the DAC 370. In one example, three DACs may be mounted on both right and left sides of the data driving IC, and the conversion may be sequentially performed 50 times in order to convert a total of 150 channel data in each DAC 370*a*, 370*b*, and a total of 300 channel data in both right and left DACs 370*a*, 370*b*. Accordingly, a 50-to-1 multiplexer 340 for sequentially transmitting the digital data to the DACs 370*a* and 370*b*, and a control signal generator circuit 350 and signals MSS[0:99] for controlling the operation of the multiplexer 340 are required. The control signals are generated from two 50-bit shift registers placed in the lower part of the N channel shift register and N-to-1 multiplexer 340.

In addition, the output signals of the 50-bit shift register 340 in the lower part are used for generating a multiplexer control signal and control signals CHSB[0:99], SHM[0:99], SHMB[0:99], SHS[0:99], and SHSB[0:99] (FIGS. 10A, 10B, 11) of a current sample/hold circuit of a final output terminal in the data driving IC. This is because the output terminal control signals are sequentially operated for the respective channels.

30-bit data DB_R0[9:0], DB_G0[9:0], and DB_B0[9:0] outputted by the multiplexer 340 are converted into analog currents Idac_R0, Idac_G0 and Idac_B0 by the left DAC 370*a*, and 30-bit data DB_R1[9:0], DB_G1[9:0], and DB_B1[9:0] are converted into analog currents Idac_R1, Idac_G1, and Idac_B1 by the right DAC 370*b*. The converted analog currents are transmitted to the current output terminals 380*a* and 380*b*.

After receiving the output currents of the DACs 370*a*, 370*b*, the 150-channel current output terminals 380*a*, 380*b* sample and hold the currents in 300 channels, and form output currents by determining currents CO[0:299] using the held data. In addition, the bias circuit 360 generates a reference voltage and a reference current used in various analog circuits of the data driving IC, and transmits the reference voltage and current values to a subsequent chip.

A row line time should be initially finished two times in order to form output currents after the entire operation of the data driving IC is finished, and then constant current data are sequentially outputted thereafter, which is similar to the way a pipeline configuration operates. Accordingly, there are merits in that uniformity between the channels is guaranteed and a required operation speed of the DAC 370 is reduced.

In addition, one DAC 370 should provide output currents to a plurality of the output channels in order to integrate 300 channels into one data driving IC. A problem associated with layout of the DAC 370 may be solved by using the above demultiplexing configuration.

Figure 7A:
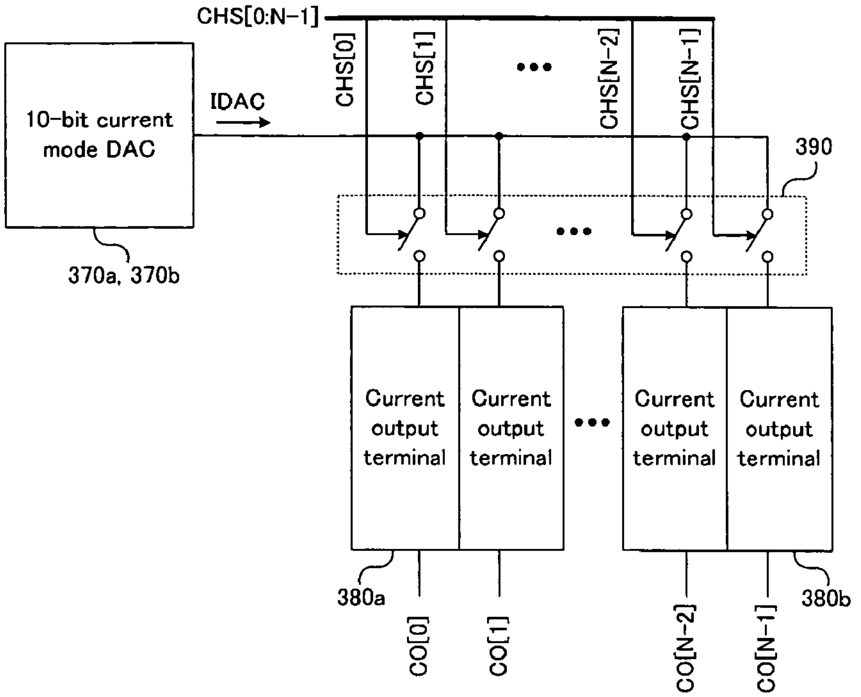
FIG. 7A shows a diagram illustrating demultiplexing mechanism of N channel current output terminals of the current driving type display device according to an embodiment of the present invention.
Figure 7B:
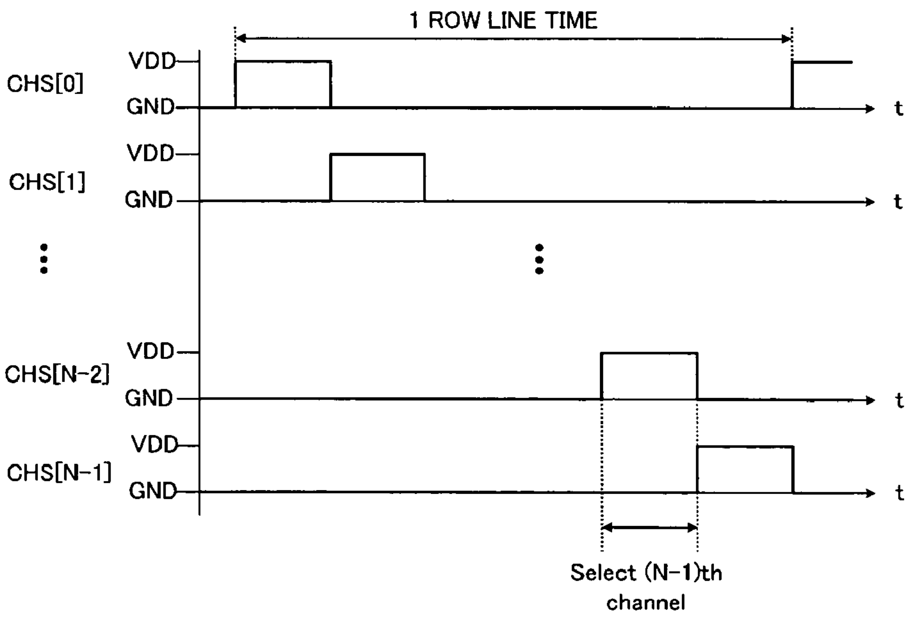
FIG. 7B shows a timing diagram for the demultiplexing mechanism of FIG. 7A.

FIG. 7A shows a demultiplexing mechanism of N channel current output terminal 380 of the current driving type display device according to the embodiment of the present invention, and FIG. 7B shows a timing diagram for demultiplexing the N channel current output terminal 380.

Referring to FIG. 7A, when one DAC 370*a* or 370*b* converts a 10-bit input video signal into an analog current signal $I_{DAC}$ and outputs the converted signal. The N current output terminals 380*a*, 380*b* sequentially receive and store the signal outputted through N switches 390 controlled by signals CHS[0:N−1]. Since D/A conversion and demultiplexing to the current output terminals 380*a*, 380*b* are performed in parallel for the respective R, G, B data, N may be 100 at most. Further, three DACs 370*a* and 370*b* should be used.

When the demultiplexing configuration is used, a configuration of the current output terminals 380*a*, 380*b* should be considered, which relates to a time for transmitting the output current signal of the DACs 370*a* and 370*b* to one current output terminal 380*a* or 380*b*.

Referring to FIG. 7B, when $T_{ROW}$ denotes one row line time for selecting all the current output terminals 380*a*, 380*b* by the respective signals CHS[0:N−1], and when N denotes the number of the current output terminals 380*a*, 380*b* shared by one DAC, a time $T_{CH}$ being allocated to one current output terminal 380*a* or 380*b* is shown in Equation 1.

$$T_{CH} = \frac{T_{ROW}}{N} \qquad \text{[Equation 1]}$$

For example, assuming that a screen resolution is WXGA (1280×RGB×768) and a frame rate is 60 Hz, $T_{ROW}$ is 21.70 μs. Accordingly, since an actually designed data driving IC uses two pairs of D/A converts 370*a* and 370*b* for the respective R, G, and B data (that is, total 6 DACs are integrated), N is 50 and $T_{CH}$ is 434 ns. However, when a WXGA Video Electronics Standards Association (VESA) standard is adopted, a vertical blank time is 790 μs, a horizontal blank time is 5.27 μs, and therefore $T_{CH}$ becomes 328 ns.

Figure 8:
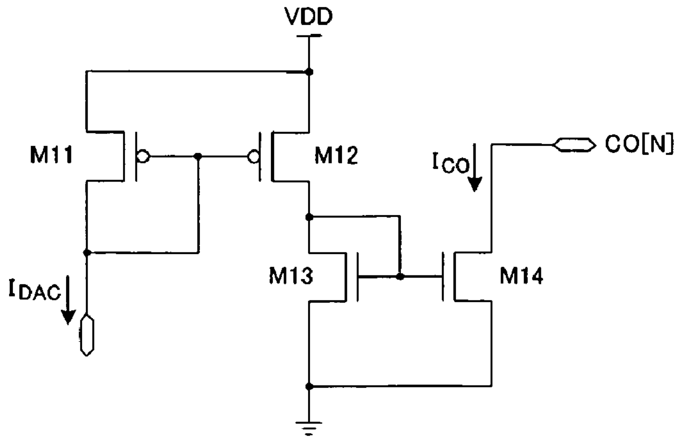
FIG. 8 shows a schematic diagram of a current mirror configuration of the current output terminal according to an embodiment of the present invention.

FIG. 8 shows a schematic diagram of a current mirror configuration of the current output terminal according to an embodiment of the present invention. The circuit shown in FIG. 8 includes transistors M11, M12, M13, and M14 coupled in current mirror configurations.

When the current output terminals 380*a*, 380*b* have a configuration for immediately outputting an analog current signal $I_{DAC}$ transmitted from the DAC 370 as shown in FIG. 8, one data line should be charged by an output current $I_{CO}$ for 328 ns while programming a program current $I_{IN}$ in a pixel at the same time.

In general, since the wide panel has a few kilo-ohms (kΩ) of equivalent resistance and tens of pF of equivalent capacitance on the data line, the output current of the data driving IC of the data driver 300 should be tens of mA in order to charge/discharge the data line for 328 ns. In this case, power consumption reaches tens of Watts for each driving IC. Further, when a circuit for tens of mA of output current is configured, transistor size is increased, and therefore it is impracticable to form the circuit for tens of mA of output current because the 300 channels may not be integrated in the data driving IC.

Figure 9A:
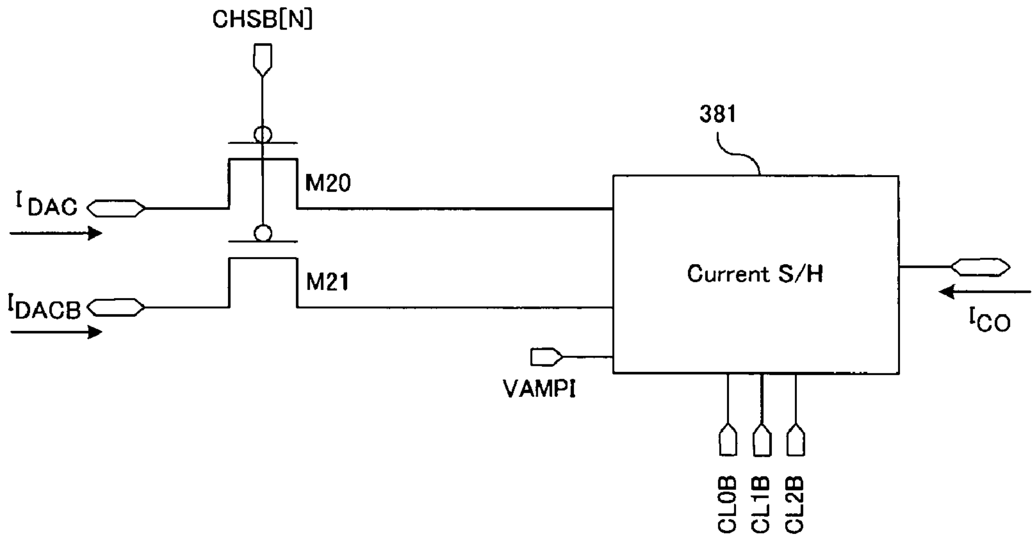
FIGS. 9A, 9B, and 9C respectively show configurations of an output terminal of the data driver of the current driving type display device according to an embodiment of the present invention.
Figure 9B:
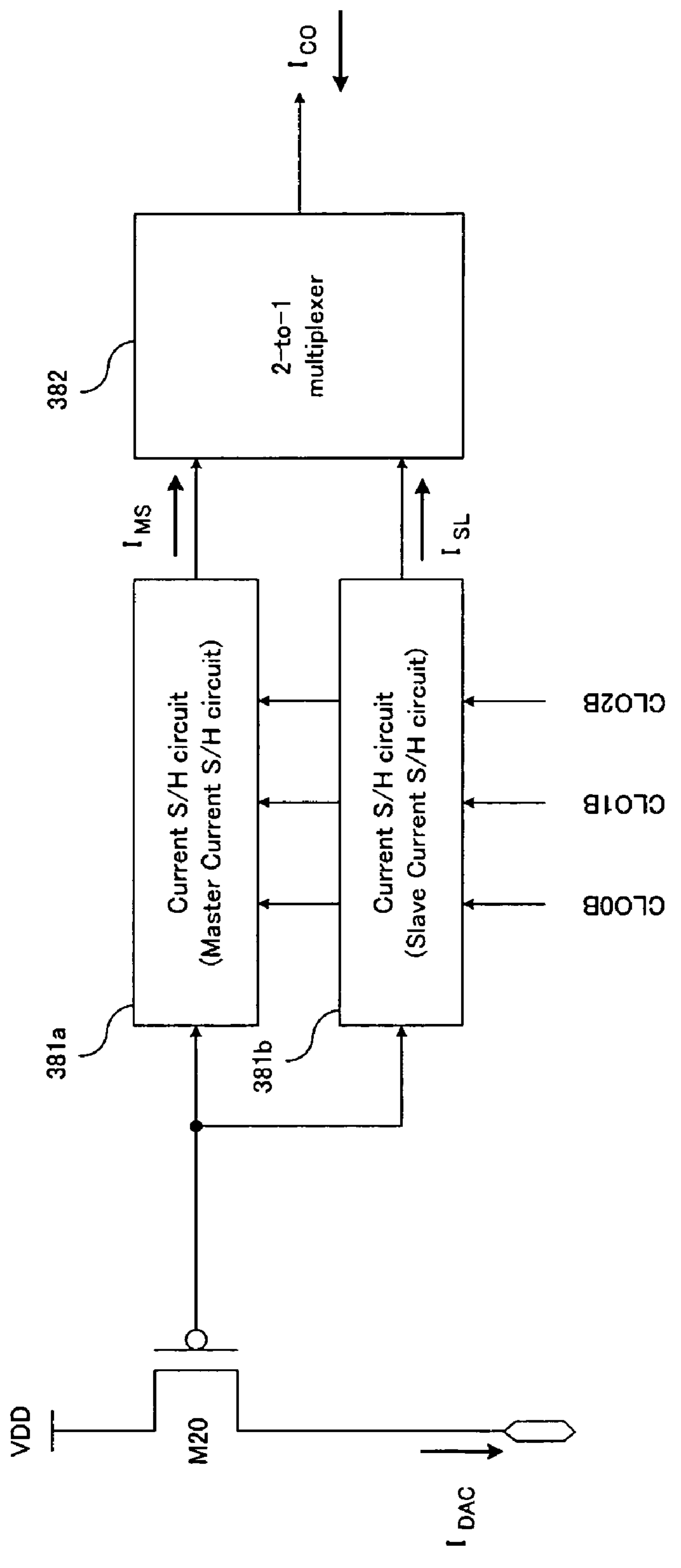
Figure 9C:
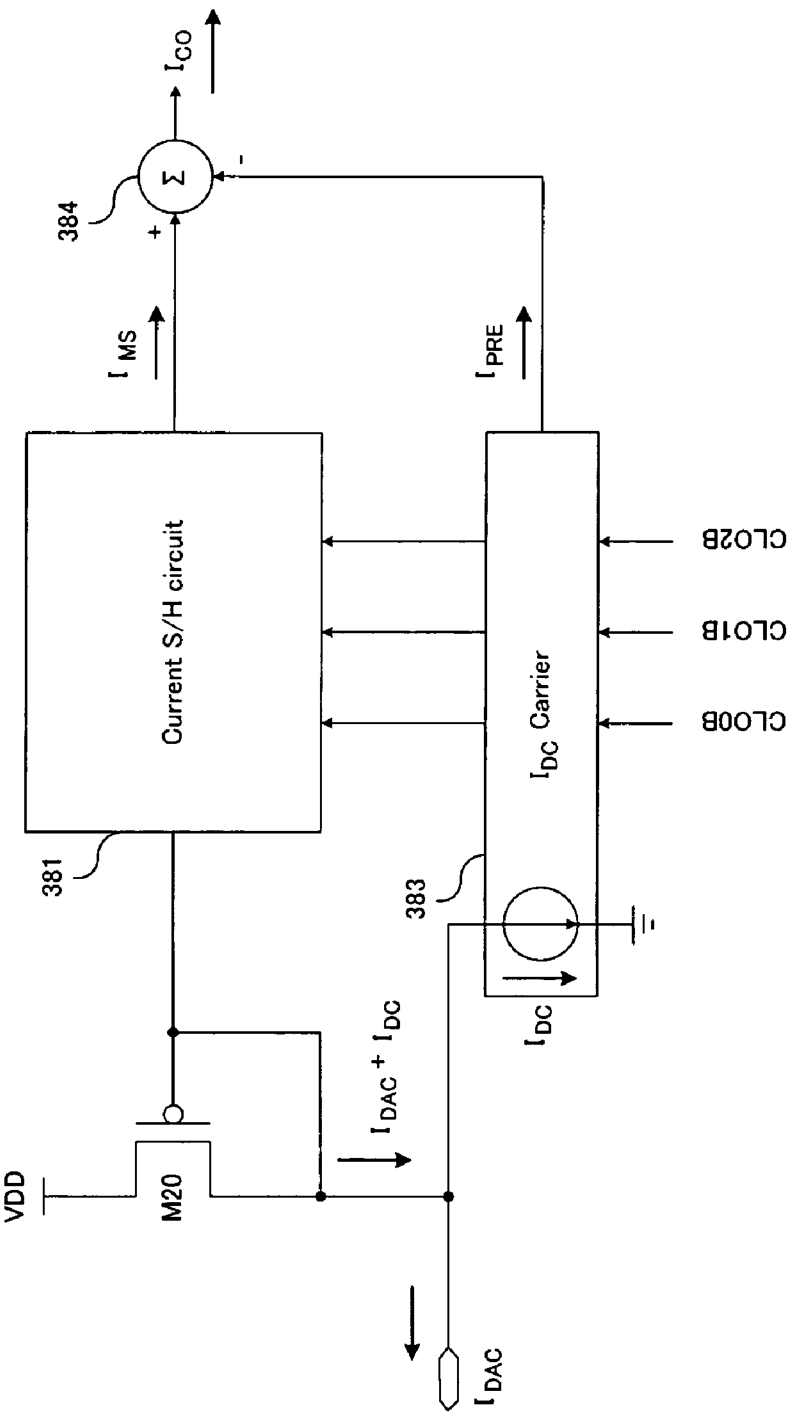

To solve the above structural problem, a current output terminal is formed in a master/slave current sample-hold configuration as shown in FIG. 9B and FIG. 9C according to another embodiment of the present invention.

FIGS. 9A, 9B, and 9C respectively show configurations of an output terminal of the data driver of the current driving type display device according to the embodiments of the present invention.

In FIG. 9A, in order to prevent a variation in the currents inputted to the current output terminal, two different input signals corresponding to two currents having a predetermined rate are transmitted as the analog output current $I_{DAC}$ of the DACs 370*a* and 370*b*, and a practical current value is determined by using a difference between the two current signals. That is, after a main signal $I_{DAC}$ and a sub-signal $I_{DACB}$ which are the analog currents of the DACs 370*a* and 370*b* are inputted to a current sample/hold (S/H) 381, the actual current value is determined by using the difference between the two current signals, and therefore an error rate is reduced.

FIG. 9B shows a schematic diagram of a master/slave S/H circuit 381*a*, 381*b* supplemented to accelerate an operation speed in the current output terminal.

FIG. 9C illustrates that, in order to prevent a delay in data writing caused by fewer currents flowing in the current output terminal, an actual current value is determined by adding a predetermined current $I_{DC}$ to the output current $I_{DAC}$ and then subtracting the added value $I_{DC}$ from the output current $I_{MS}$ before a final output $I_{CO}$.

Unlike FIG. 8, the output terminal of the DAC 370 is sampled and held by the current output terminal in the configurations shown in FIG. 9B and FIG. 9C. The master current sample-hold circuit 381*a* and the slave current sample-hold circuit 381*b* are of the same type, and the current sample-hold circuits 381*a* and 381*b* alternately sample and hold the current. The sampling and holding operations are mutually exclusively performed.

That is, when the master current sample-hold circuit 381*a* samples the analog output current $I_{DAC}$ of the DAC 370*a* and 370*b*, the slave current sample-hold circuit 381*b* programs a value of $I_{CO}$ to the pixel of the panel while holding a value of $I_{SL}$ which is a value of $I_{DAC}$ sampled for a previous row line time. In contrast, when the slave current sample-hold circuit 381*b* samples $I_{DAC}$, the master current sample-hold circuit 381*a* programs a value of $I_{CO}$ to the pixel of the panel while holding a value of $I_{MS}$ which is a value of $I_{DAC}$ sampled during a previous row line time.

According to the above configuration, while a current sampling time is equal to the previous $T_{CH}$, a time for charging/discharging the data line of the panel is increased to the row line time, and therefore the time for charging/discharging the data line may be guaranteed.

While the time for charging/discharging the data line is guaranteed by using the master/slave current sample-hold circuits 381*a* and 381*b*, it is still required that the output current of the DACs 370*a* and 370*b* is sampled at the current output terminals 380*a*, 380*b* for the time $T_{CH}$.

In this case, a problem of charge/discharge of wire lines in the data driving IC should be also considered as well as the problem of charge/discharge of the data lines on the panel. As described above, the signal transmission between the DACs 370*a* and 370*b* and the current output terminals 380*a*, 380*b* is performed by demultiplexing the signal.

Accordingly, a length of a signal wire line from an output signal port of the DACs 370*a* and 370*b* to the input of the current output terminals 380*a*, 380*b* is 9000 μm at maximum. In this case, the signal wire line equivalently has hundreds of ohms (Ω) of parasitic resistance and a few pF of parasitic capacitance.

Besides the signal wire line, a diode-connected metal oxide semiconductor (MOS) transistor M20 is also a load to be charged/discharged by the current output signal of the DACs 370*a* and 370*b*. A trans-conductance value $g_m$ of the MOS transistor M20 is steeply reduced as current level is reduced. Specifically, when the MOS transistor M20 operates within a sub-threshold region, a tailing effect occurs such that the charge/discharge time is delayed due to a reduced $g_m$ value. Even if a first least significant bit (LSB) value of the DAC is increased to more than several μA in order to increase a minimum current level for charge/discharge, a W/L ratio of the MOS transistor should be increased because a maximum current value is 1024 times the first LSB value.

When the W/L ratio of the MOS transistor M20 is increased, the MOS transistor M20 operates within the sub-threshold region even if the minimum current level is more than several μA. Accordingly, a problem of charge/discharge of the signal wire line and the MOS transistor M20 may not be solved by linear scaling of the current value of the DACs 370*a* and 370*b*.

According to the embodiment of the present invention, as shown in FIG. 9C, the problem of charge/discharge of the signal wire line and the MOS transistor M20 is solved by a configuration in which DC currents $I_{DC}$ are applied to the output signals of the DACs 370*a* and 370*b* and then the applied DC current signals $I_{DC}$ are subtracted from the output currents of the current output terminals 380*a* and 380*b*.

Figure 10A:
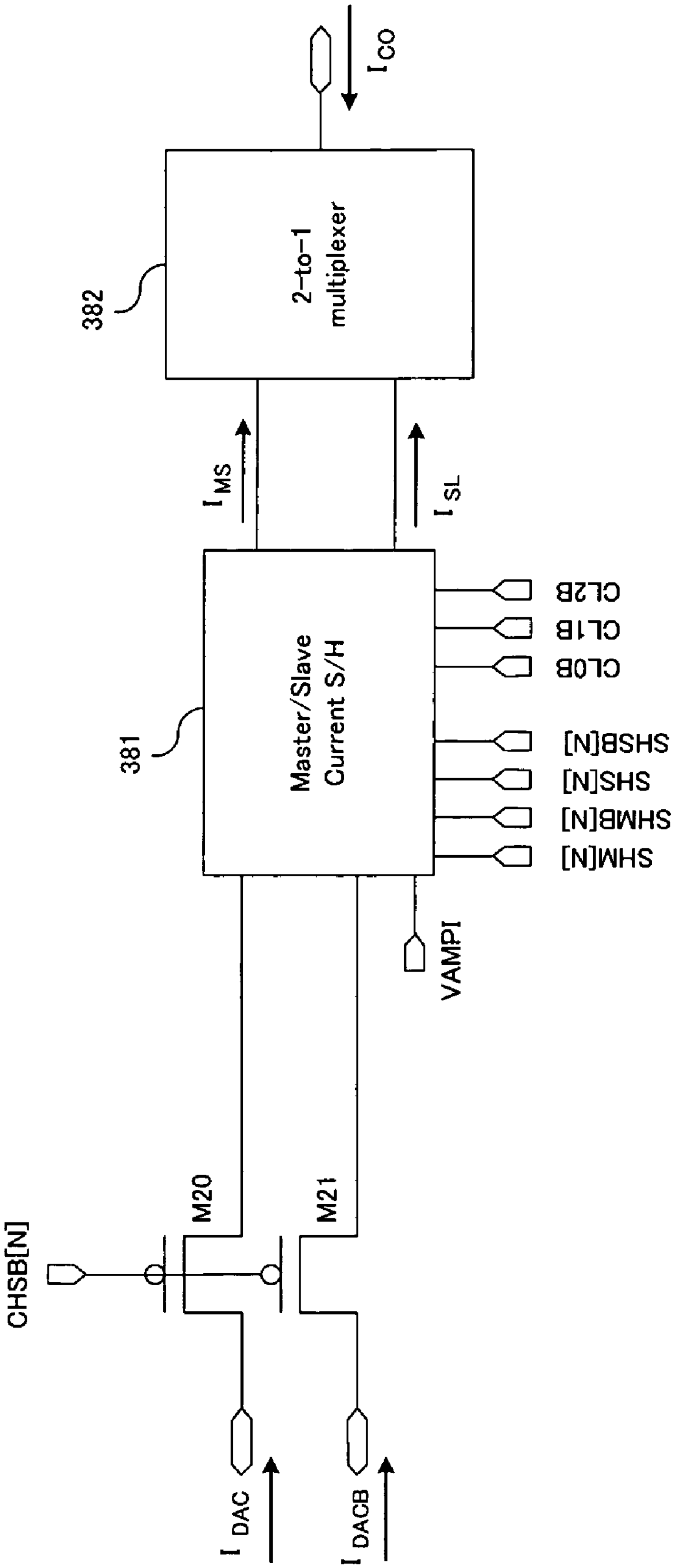
FIGS. 10A, 10B, and 10C respectively show configurations of the output terminal of the data driver of a current driving type display device according to another embodiment of the present invention.
Figure 10B:
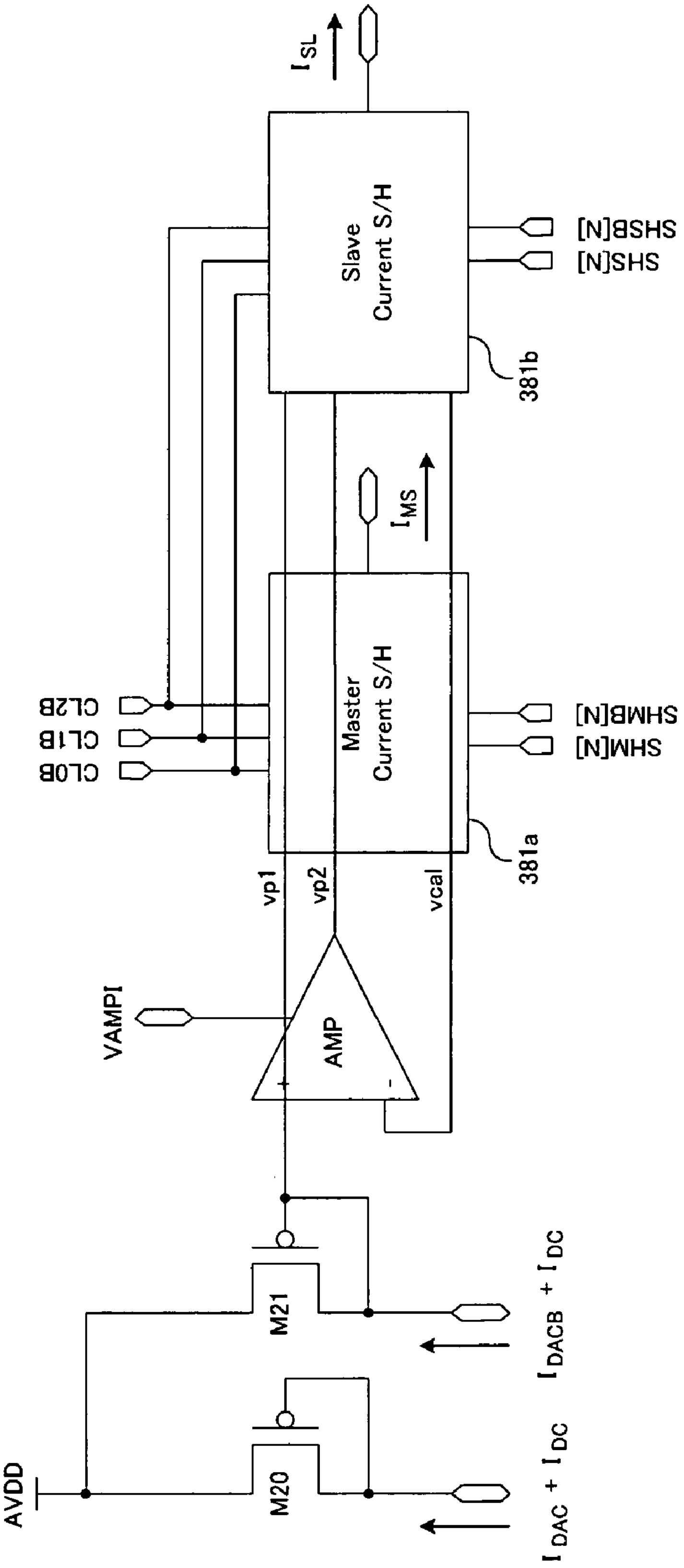
Figure 10C:
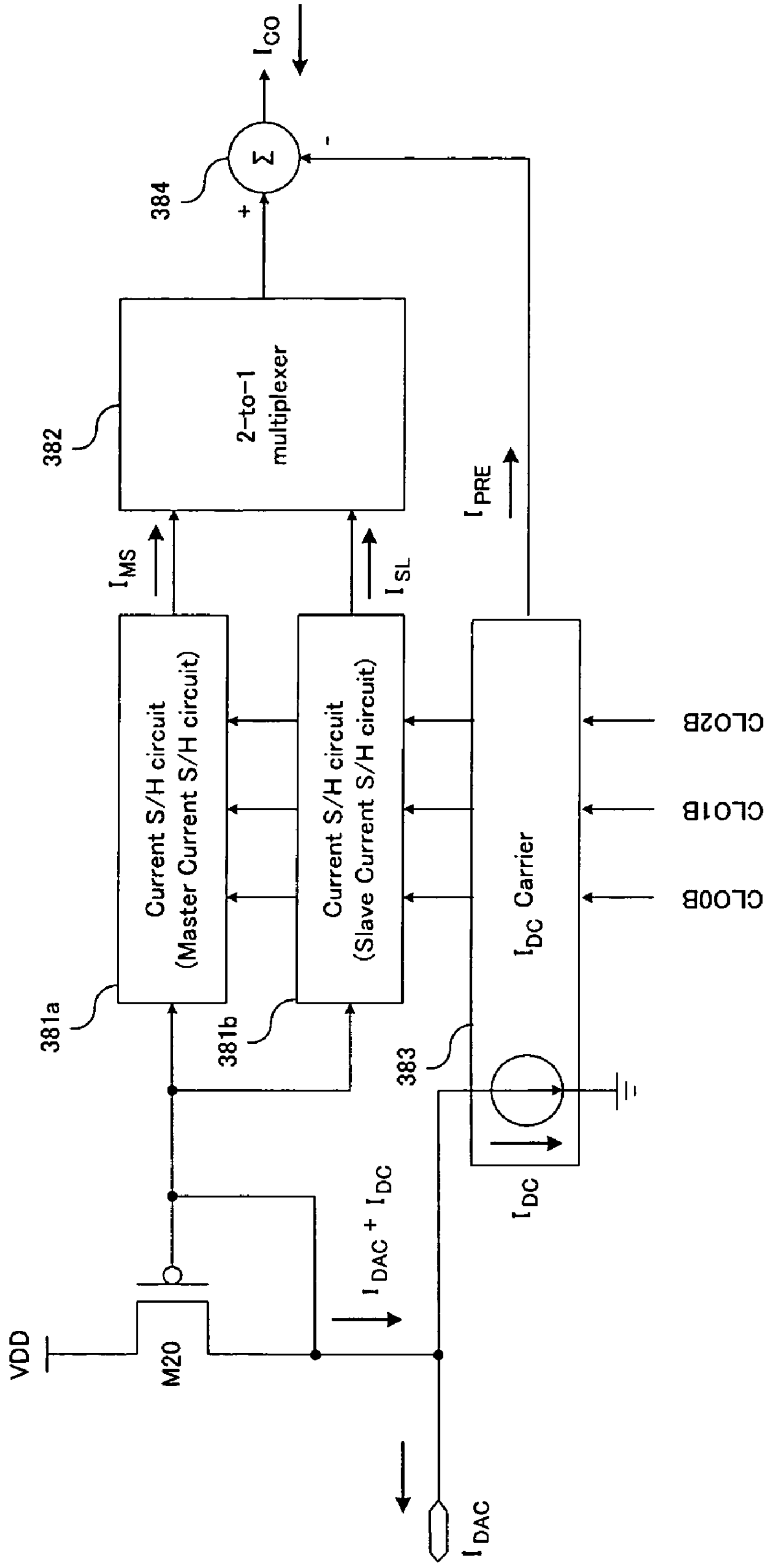

FIGS. 10A, 10B, and 10C show circuit configurations of an output terminal of a data driver of a current driving type display device according to another embodiment of the present invention.

The output terminal of FIG. 10A performs functions of the data drivers of FIG. 9A and FIG. 9B, and FIG. 10B illustrates a circuit of FIG. 10A, in detail. The output terminal of FIG. 10C performs functions of the data drivers of FIG. 9B and FIG. 9C, and will be described in more detail with reference to FIG. 11.

Figure 12:
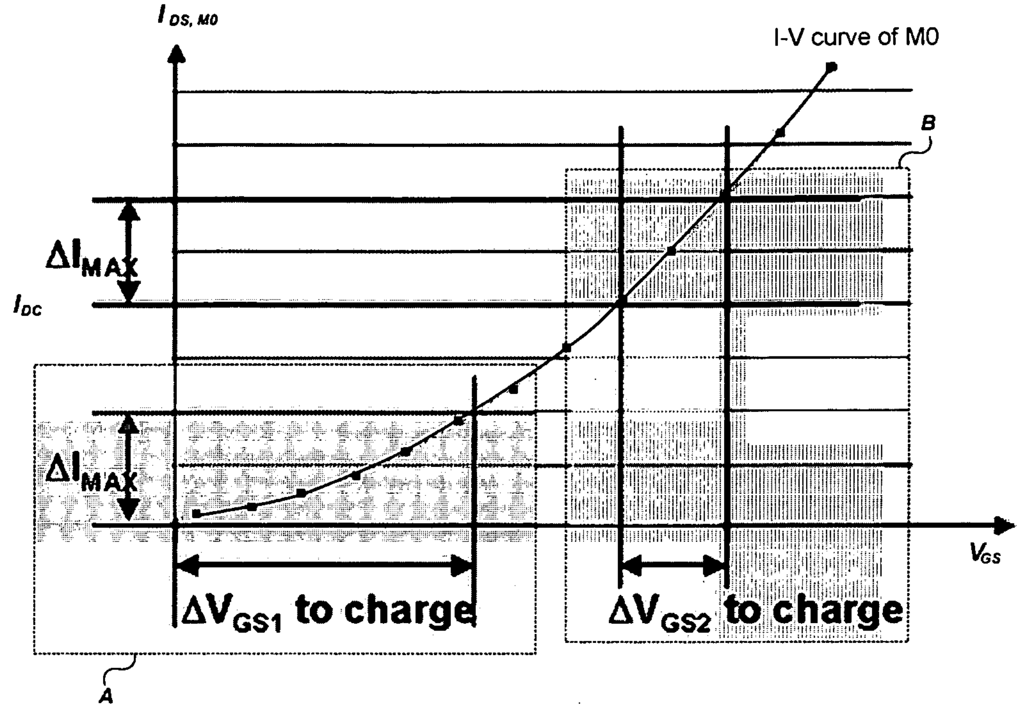
FIG. 12 shows a current characteristic curve in areas A and B. The area A shows a current characteristic curve when a current source IDC is applied to a MOS diode M20 of an output terminal of a data driver, and the area B shows a current characteristic curve when the current source IDC is not applied to the MOS diode M20.

FIG. 12 conceptually illustrates an operation of a current source $I_{DC}$ in the $I_{DC}$ carrier block 383 of FIG. 9C.

FIG. 12 illustrates a current characteristic curve in areas A and B. The area A shows a current characteristic curve when a current source $I_{DC}$ is applied to a transistor M20 of an output terminal of a data driver, and the area B shows a current characteristic curve when the current source $I_{DC}$ is not applied to the transistor M20.

When an output current range of DACs 370*a* and 370*b* is set to be 0 to $I_{MAX}$, the transistor M20 of FIG. 9A to FIG. 9C operates within the area A when the current source $I_{DC}$ is not applied to this transistor. Whereas the transistor M20 of FIGS. 9A, 9B, and 9C operates within the area B when the current source $I_{DC}$ is applied to it. As shown in FIG. 12, current tailing may be incurred since the transistor M20 can be operated in a sub-threshold region within the area A.

However, the transistor M20 operates in a saturation region within the area B, and thus the current tailing is not incurred. In addition, because it is possible to design a maximum current level of the DACs 370*a* and 379*b* to be lower, the current output terminals 380*a*, 380*b* may be designed without increasing a W/L ratio of the transistor M20. Not having to increase the proportions of the transistors uses saves space.

Referring back to FIG. 6, the bias circuit 360 generates reference current sources Idac1-Idac6 which are necessary for operation of the DACs 370*a* and 370*b*, and supplies the reference current sources to 6 DACs 370*a* and 370*b* of the data driving IC. In addition, the bias circuit 360 generates a reference voltage signal for the current output terminals 380*a* and 380*b*.

The DACs 370*a* and 370*b* integrated with the data driving IC according to the embodiment of the present invention form a typical current mode DAC, and thus a DATA[9:0] stored in a holding latch of a digital block is synchronized with a rising edge of a CLKL clock signal and stored in a sampling latch. The stored signal is processed by a decoder, and thus 6 higher order bits of the signal control a 6-bit thermometer-coded current array and 4 lower order bits thereof control a binary-weighted current array. The respective current arrays output currents corresponding to data. An analog output current $I_{DAC}$ that corresponds to a sum of the currents output from the current arrays is transmitted to the respective current output terminals.

The 10-bit current mode DACs 370*a*, 370*b* output one of the currents divided by 1024 levels from a reference current source generated by the bias circuit 360 and transmit the output current to the current output terminals 380*a*, 380*b*. The current output range of the DACs 370*a*, 370*b* may be set to be different for the respective red, green, and blue (RGB) colors. However, this requires separate bias generating circuits for the respective DACs 370*a*, 370*b*. Addition of the separate bias generation circuits may increase the area of the ICs and degrade uniformity between the DACs 370*a*, 370*b*.

Figure 11:
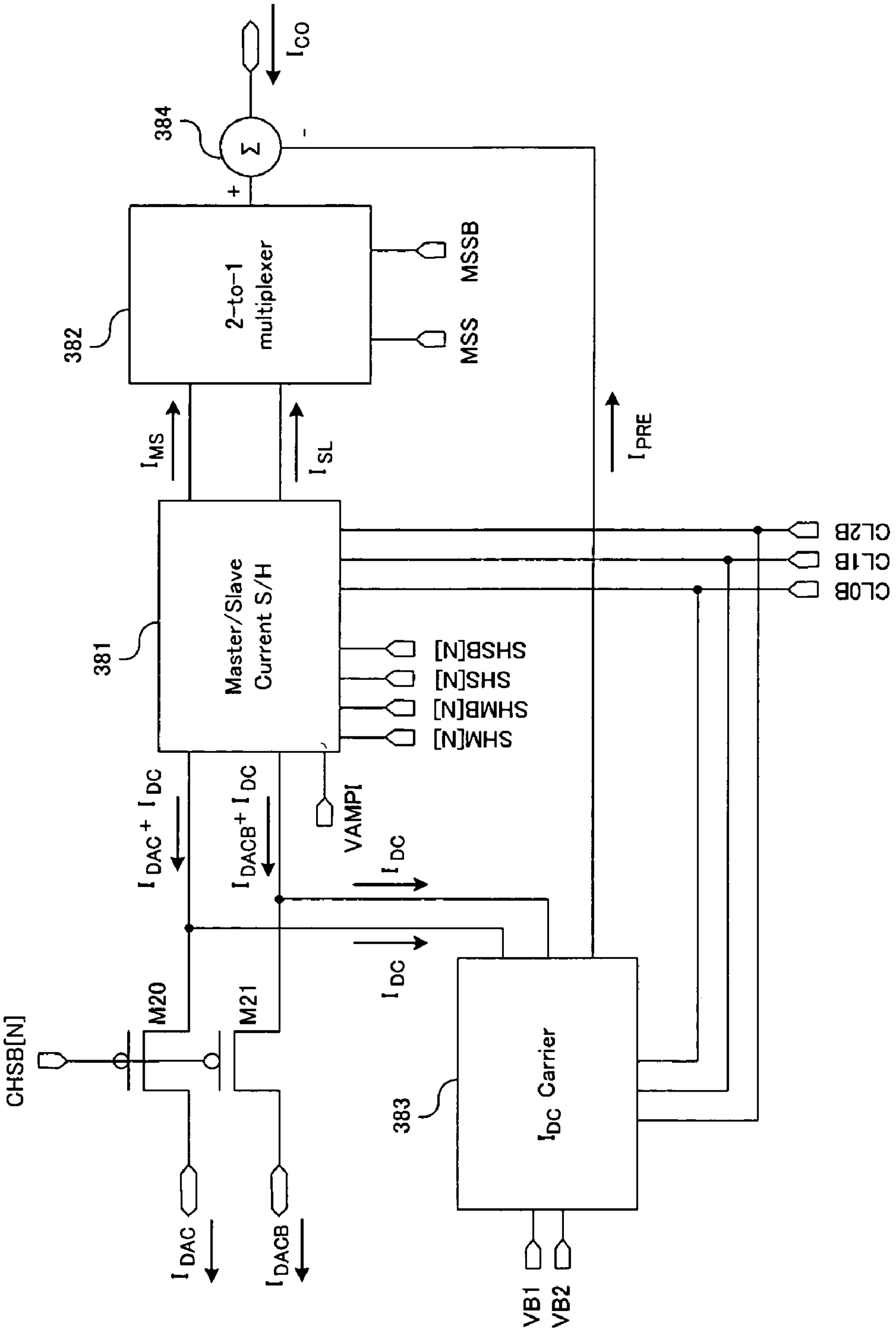
FIG. 11 illustrates an output terminal of a data driver of a current driving type display device according to a detailed embodiment of the present invention.

FIG. 11 illustrates an output terminal of a data driver 300 of a current driving type display device according to a detailed embodiment of the present invention.

Referring back to FIG. 6, the output currents $I_{DAC}$ of DACs 370*a*, 370*b* are sequentially sampled and stored in the respective current output terminals. It is desired that the current output terminals 380*a*, 380*b* accurately sample the output currents $I_{DAC}$ within a predetermined time (WXGA reference 328 ns) for each channel, and an area for each current output terminal is minimized such that each current output terminal is arranged within 52 μm pitch.

The foregoing problems of the current output terminals 380*a*, 380*b* of the data driving IC may be solved by using the master/slave current S/H circuits 381*a* and 381*b* (FIG. 6) and an $I_{DC}$ carrier 383 (FIG. 11).

A current signal $I_{DAC}$ and a sub-current signal $I_{DACB}$ input from the DACs 370*a*, 370*b* are added to a current $I_{DC}$ generated by the $I_{DC}$ carrier block 383 and a sum of the current signal $I_{DAC}$, the sub-current signal $I_{DACB}$, and the current $I_{DC}$ are the transmitted to master/slave current S/H blocks 381*a*, 381*b*. In this instance, a CHSB signal controls PMOS switches M20 and M21 to select the n-th current output terminal only from the current output terminals 380*a*, 380*b*.

The master/slave current S/H blocks 381*a* and 381*b* that are equivalent to the pre-described master/slave current S/H circuits store a sum of the input currents ($I_{DAC}$+$I_{DC}$) in the master current S/H circuit 381*a* or in the slave current S/H circuit 381*b*.

When SHM[N]/SHMB[N] and SHS[N]SHSB[N] have high logical values, the input currents are sampled and stored in the master current S/H circuit 381*a* and the slave current S/H circuit 381*b*, respectively.

Output currents $I_{MS}$ and $I_{SL}$ of the respective master/slave current S/H circuits 381*a* and 381*b* (shown on FIG. 6 and FIG. 11) are amplified to an integer multiple, and selectively transmitted to a final output current $I_{CO}$ according to control signals MSS/MSSB to drive the AMOLED panel.

The $I_{DC}$ carrier block 383 transmits a current signal $I_{PRE}$ to an output mirror to remove the current $I_{DC}$ added in input units of the current output terminals 380*a* and 380*b*, and the output mirror outputs the final output current $I_{CO}$ after subtracting the current signal $I_{PRE}$ from the output current $I_{MS}$ or $I_{SL}$. In this instance, the output mirror may include a 2-to-1 multiplexer 382 and an adder 384. VB1, VB2, VAMPI, VAMPO, and VREF are bias signals supplied to each block. CL0B–CL2B are control signals that control an output range of the final output current $I_{CO}$.

Figure 13:
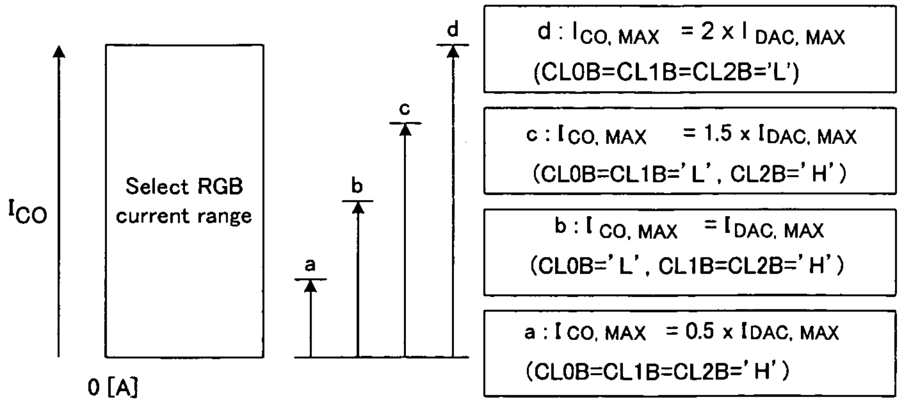
FIG. 13 shows an output range of the current output terminal of the data driver according to an embodiment of the present invention, and exemplarily shows the output range of the final output current $I_{CO}$ according to combinations of the CL0B, CL1B, and CL2B.

FIG. 13 shows an output range of the current output terminal of the data driver 300 according to an embodiment of the present invention. The output range of the final output current $I_{CO}$ according to combinations of the CL0B–CL2B is also shown.

TABLE 1

| CRS[1:0] | CL2B | CL1B | CL0B | $I_{CO}$ | $I_{CO.LSB}$ |
|---|---|---|---|---|---|
| '00' | 1 | 1 | 1 | 0 μA~74.25 μA | 72.5 nA |
| '01' | 1 | 1 | 0 | 0 μA~148.5 μA | 145.0 nA |
| '10' | 1 | 0 | 0 | 0 μA~222.75 μA | 217.5 nA |
| '11' | 0 | 0 | 0 | 0 μA~297.0 μA | 290.0 nA |

A maximum output range of an output current $I_{CO}$ of the data driving IC is set to be 0 μA–297 μA, and current levels are determined through video data after equally dividing the output range by 1204 levels according to an embodiment of the present invention. In this instance, 1 LSB current is 290 nA. However, the current levels and the current output range may vary depending on colors or a pixel structure of a panel. Therefore, in order to increase general utility of the data driving IC, it is desired that the output current range may be proportionally reduced within the maximum output current range.

Thus, the current S/H circuits 381*a* and 381*b* and the $I_{DC}$ carrier are embedded with a 2-bit DAC such that a current output range of four steps is obtained as shown in FIG. 13. A control signal controlling the 2-bit DAC includes CRS_R [1:0], CRS_G[1:0], and CRS_B[1:0] for the respective red, green, and blue (RGB) colors. The CRS signals (not shown) are processed through a decoder of the data driving IC and generate CL0B–CL2B signals.

Figure 14A:
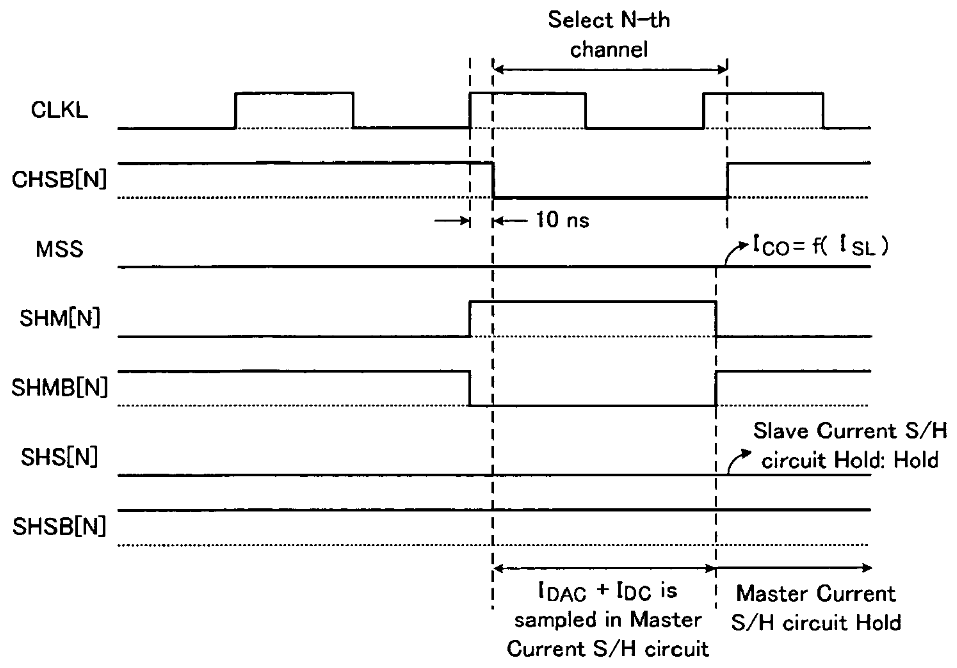
FIG. 14A and FIG. 14B respectively illustrate operational timings of a current output terminal of a data driver, illustrating timings of a digital control signal applied to the current output terminal according to an embodiment of the present invention.
Figure 14B:
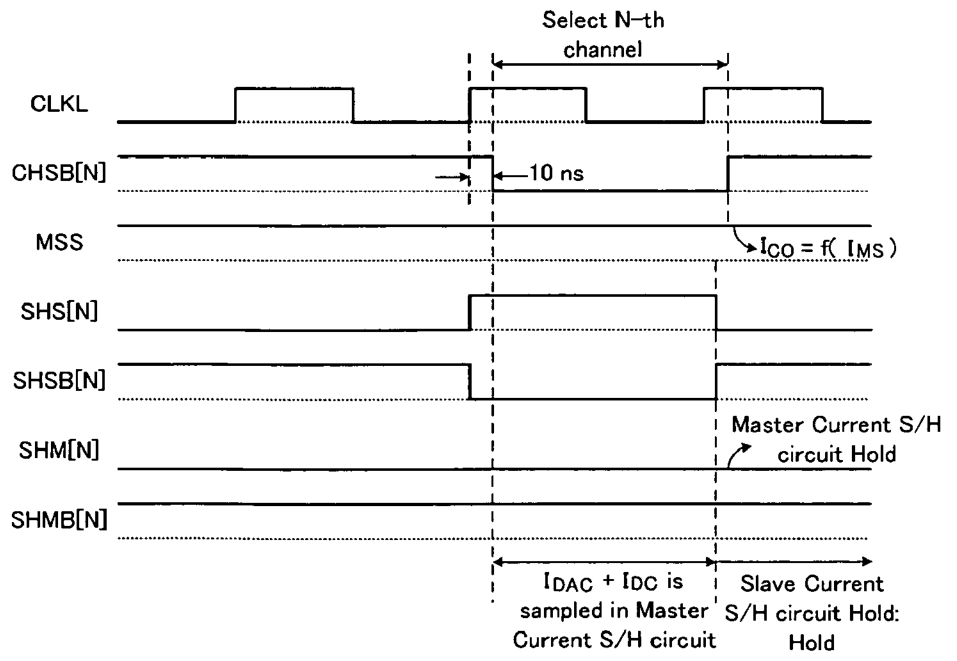

FIG. 14A and FIG. 14B respectively illustrate operational timings of a current output terminal of a data driver 300, illustrating timings of a digital control signal applied to the current output terminal according to an embodiment of the present invention.

FIG. 14A relates to when a signal MSS has a low logical value, and in this case, an output current $I_{CO}$ is output corresponding to the output current $I_{SL}$ and outputs a processed current, and a master current S/H circuit 381*a* samples an input current $I_{DAC}$. On the contrary, FIG. 14B relates to a case that the signal MSS has a high logical value, and in this case, the current $I_{CO}$ receives and processes an output current $I_{MS}$ and output a processed current, and a slave current S/H circuit 381*b* samples the input current $I_{DAC}$. The signal MSS is inverted in every one low-line time during a driving time of the AM-OLED such that the master current S/H circuit 381*a* and the slave current S/H circuit 381*b* are alternatively and periodically performed.

Figure 15:
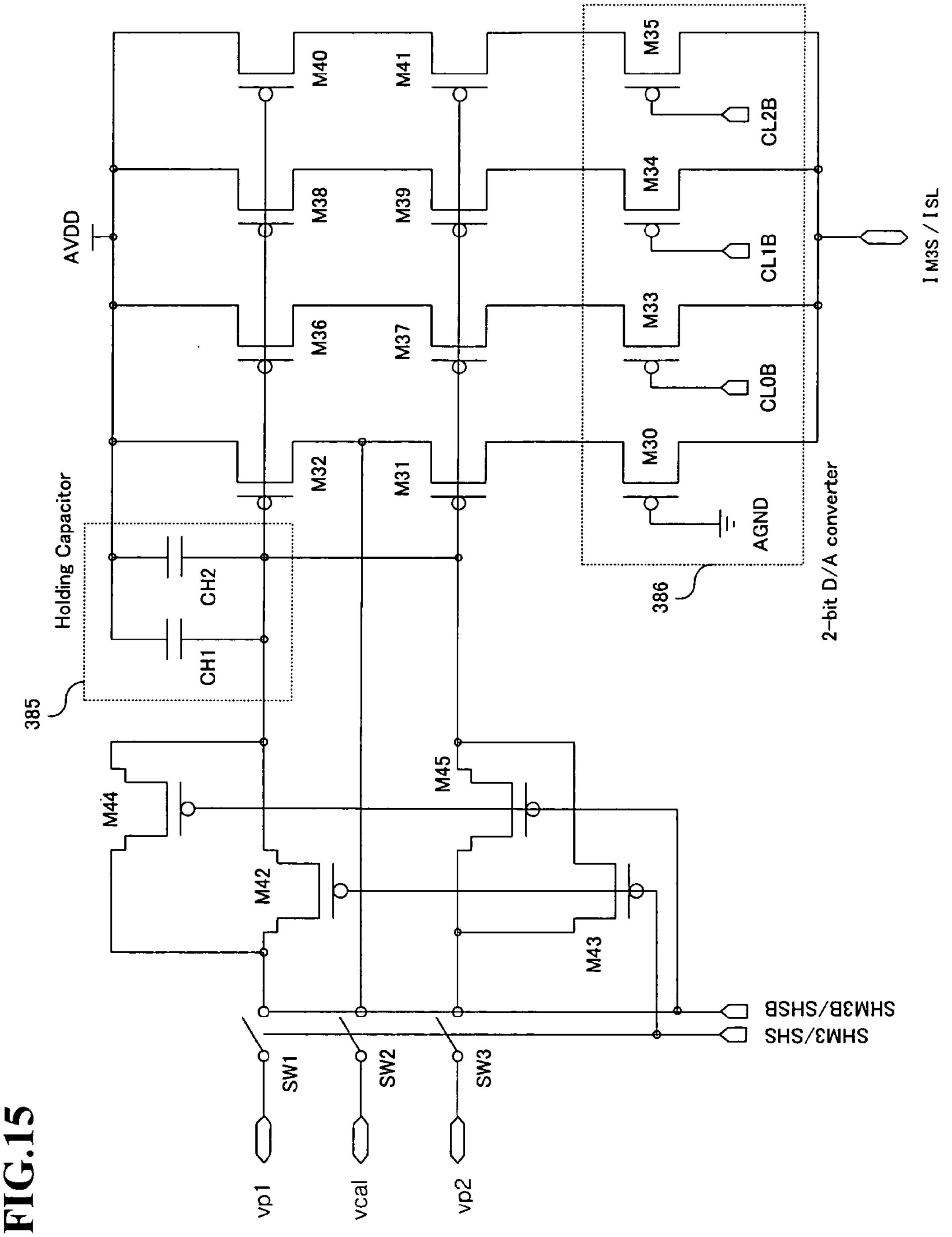
FIG. 15 illustrates a circuit diagram of a current sample/hold (S/H) block of a current output terminal of a data driver according to an embodiment of the present invention.

FIG. 15 illustrates a circuit diagram of a current S/H block of a current output terminal of a data driver according to an embodiment of the present invention. The circuit of FIG. 15 includes transistors M30 through M45 and capacitors CH1 and CH2 coupled to switches SW1, SW2, and SW3.

In FIG. 10B, the input current signals $I_{DAC}+I_{DC}$ and $I_{DACB}+I_{DC}$ are respectively programmed in the transistors M20 and M21. Actually, the signal $I_{DACB}+I_{DC}$ is a dummy signal that maintains loads of the main input current signal $I_{DAC}$ and the sub-input current signal $I_{DACB}$ of the DAC at a given level to thereby prevent decrease of conversion speed of the DAC. The signal $I_{DAC}+I_{DC}$ programmed in the transistor M21 of FIG. 10B is sampled in the master current S/H circuit 381*a* or the slave current S/H circuit 381*b*.

Circuit structures of the master and slave current S/H circuits 381*a*, 381*b* (not shown in FIG. 15) are the same, and the transistor M31 has a current mirror structure and transmits a value obtained by proportionally reducing 8 times the signal $I_{DAC}+I_{DC}$ to transistors M32, M36, M38, and M40 of FIG. 15. In addition, a differential amplifier and transistors M31, M37, M39, and M41 increase output resistance of transistors M32, M46, M38 and M40 that are current sources in the current S/H circuits 381*a*, 381*b* (not shown in FIG. 15).

This implies a mechanism where gate bias voltages of transistors M31, M37, M39, and M41 of FIG. 15 are controlled such that a drain node voltage of the transistor M31 becomes equal to drain node voltages of the transistors M37, M39, and M41 of FIG. 15. This occurs by amplifying the drain node voltage of the transistor M21 of FIG. 10B using the differential amplifier of FIG. 15 since the transistor M21 is not a cascade transistor.

Sampling and holding operations of the current signal is controlled by a switch and a PMOS switch controlled by SHM (SHS) and SHMB (SHSB) signals. The sampling operation is performed by storing the gate voltage of the transistor M21 of FIG. 10B in a holding capacitor 385 of FIG. 15 when the switch and the PMOS switch are closed. The holding capacitor 385 includes the capacitors CH1 and CH2. When the switch and the PMOS switch are opened, the holding operation is performed such that CH1 and CH2 become floating capacitors holding the stored voltage and a constant current flows to transistors M32, M36, M38, and M40 of FIG. 15. In addition, the current flowing to the transistors M32, M36, M38 and M40 is output after being converted into an output current $I_{MS}$ or $I_{SL}$. Accordingly, a maximum value of the output current $I_{MS}$ or $I_{SL}$ corresponds to at least the signal $I_{DAC}+I_{DC}$ reduced by a factor of eight and at most the same signal $I_{DAC}+I_{DC}$ reduced by a factor of two.

Figure 16:
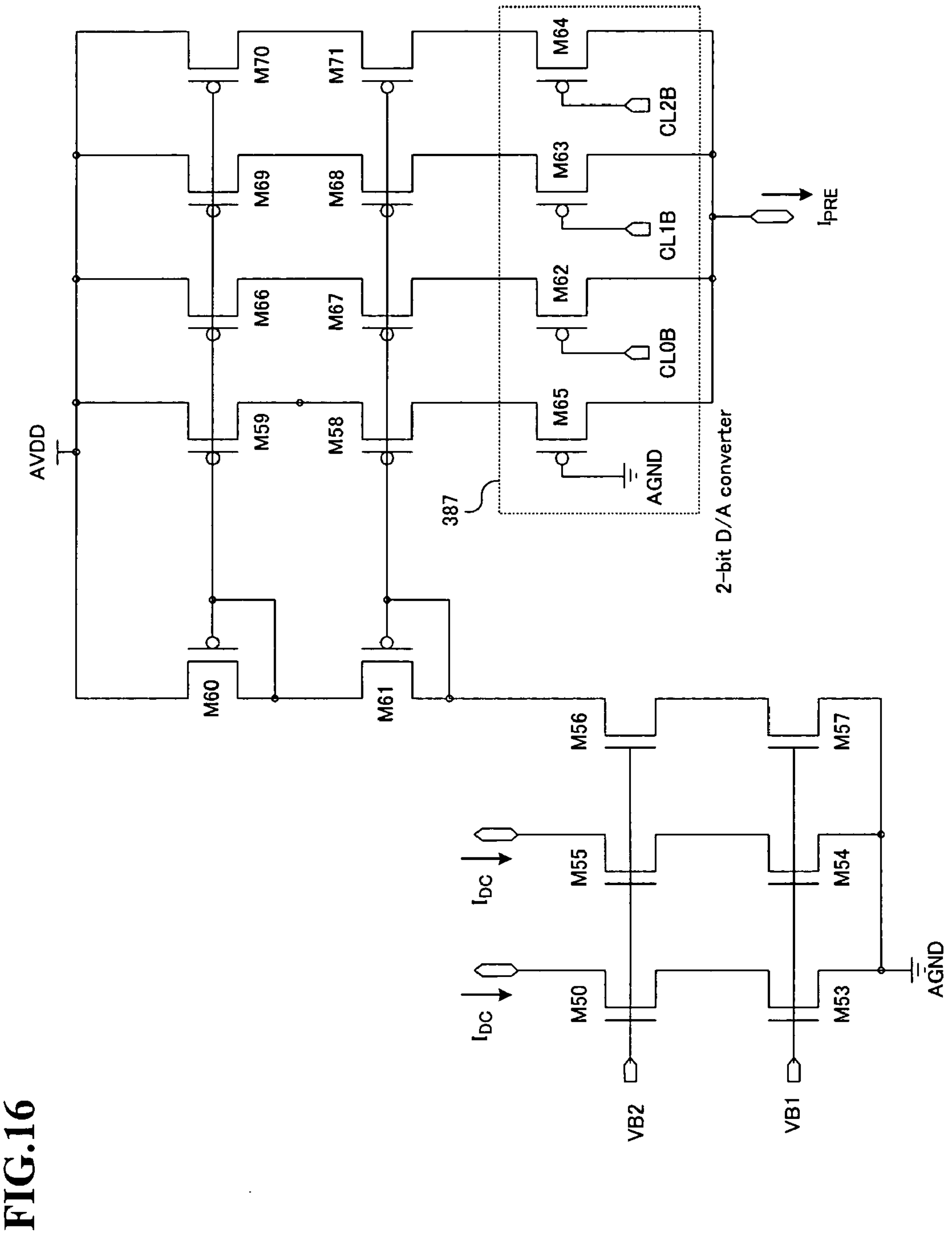
FIG. 16 is a circuit diagram of an $I_{DC}$ carrier block of a current output terminal of a data driver according to an embodiment of the present invention.

FIG. 16 is a circuit diagram of an $I_{DC}$ carrier block 383 of a current output terminal of a data driver 300 according to an embodiment of the present invention. The circuit of FIG. 16 includes transistors M50, and M53 through M71.

A current $I_{DC}$ is generated by applying analog voltages VB1 and VB2 generated by a bias block to gate nodes of transistors M50, M53, M54, and M55. A target value of the $I_{DC}$ is set to be 20 μA. In this instance, the generated current $I_{DC}$ is proportionally reduced or amplified through a 2-bit DAC 387 and transmits a signal $I_{PRE}$ to an output mirror block. This prevents the current $I_{DC}$ from being proportionally reduced in the master/slave current S/H blocks 381*a* and 381*b*.

In addition, a value of the current $I_{DC}$ is noticeable in an $I_{DC}$ carrier block 383. When a circuit is operated, the circuit may not necessarily output a current $I_D$ of 20 μA. An additional role of the current $I_{DC}$ is to control all the transistors to be operated in the saturation region, and to increase operation speed of the transistors even though the value of the current $I_{DC}$ is low when a current $I_{DAC}$ flows through the current output terminals 380*a*, 380*b*.

Therefore, a matching of channel width to length ratios of transistors M50, M53, M54, and M55 may not be important as long as the values of the current $I_{DC}$ and the signal $I_{PRE}$ of FIG. 16 are maintained as integer multiples. However, it matters whether or not transistors of the current output terminals 380*a*, 380*b* are matched with each other. In other words, in order to prevent a final output of the current output terminals 380*a*, 380*b* from being influenced by the $I_{DC}$ carrier block 383, matching between transistors M50, M55, and M56 and matching between transistors M53, M54, and M57 of FIG. 16 need to be guaranteed.

Figure 17:
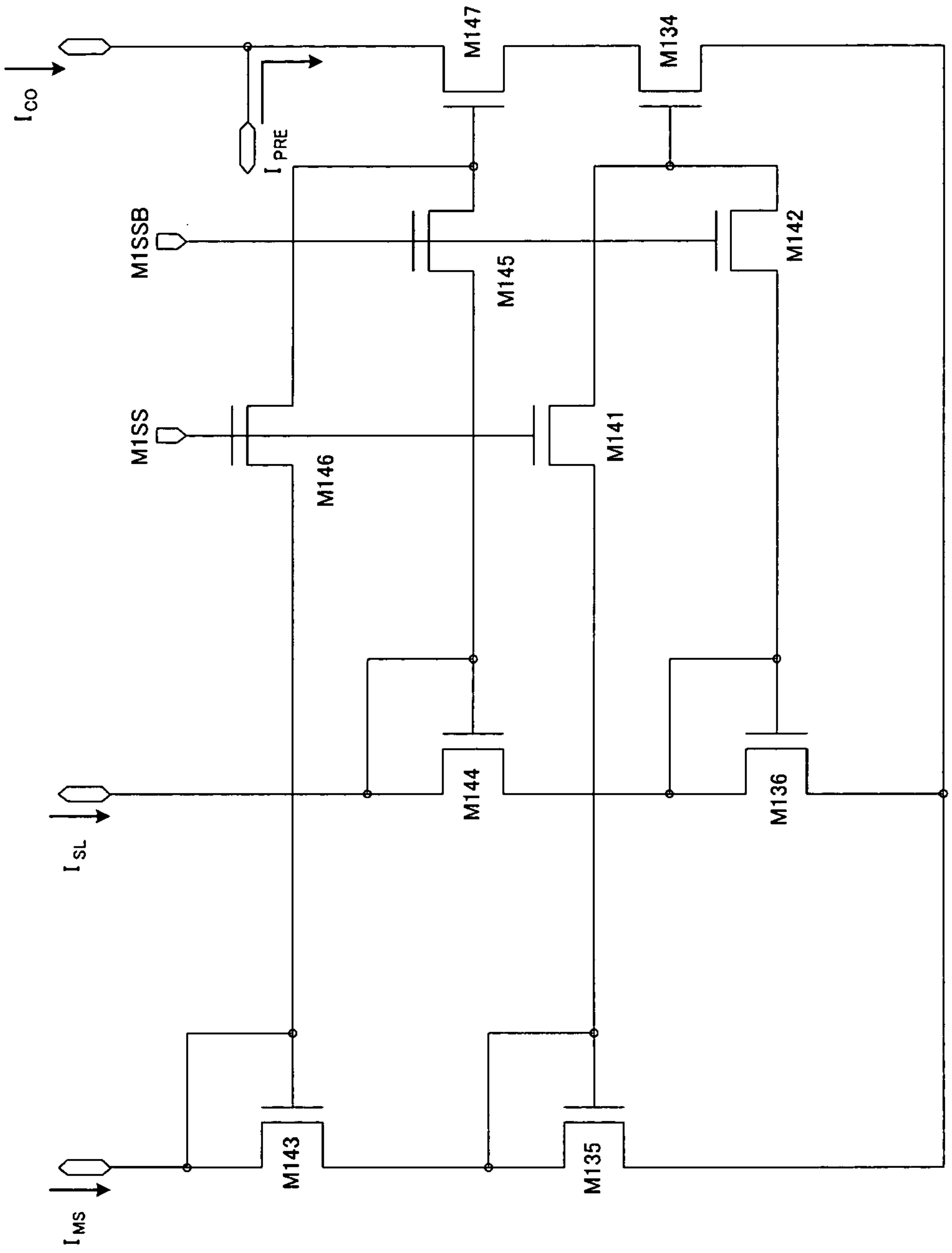
FIG. 17 is a circuit diagram illustrating a 2-to-1 multiplexer block of a current output terminal of a data driver according to an embodiment of the present invention.

FIG. 17 is a circuit diagram illustrating a 2-to-1 multiplexer block 382 of a current output terminal of a data driver 300 according to an embodiment of the present invention. The circuit of FIG. 17 includes transistors M134, M135, M136, and M141 through M147. As previously described, FIG. 17 illustrates an output current mirror block as the 2-to-1 multiplexer that is a final terminal of the current output terminal, and the adder 384 is also substantially included in the circuit.

A final current $I_{CO}$ is output by operating output current signals $I_{MS}$ and $I_{SL}$ of the master/slave current S/H circuits 381*a* and 381*b* and an output signal $I_{PRE}$ of the $I_{DC}$ carrier block 383 so as to drive the AMOLED panel.

As described with reference to FIG. 14A and FIG. 14B, one of the output signals $I_{MS}$ and $I_{SL}$ is selected and output as the final output current $I_{CO}$, according to the MSS/MSSB signals. The output signals $I_{MS}$ and $I_{SL}$ and the $I_{PRE}$ current are proportionally amplified and reduced according to CL0B–CL2B, as shown in Equation 2 and Equation 3.

$$I_{MS}=I_{SL}=\alpha\times(I_{DAC}+I_{DC}) \quad \text{[Equation 2]}$$

$$I_{PRE}=4\times\alpha\times I_{DC}$$

$$I_{CO}=4\times I_{MS}-I_{PRE}=4\times I_{SL}-I_{PRE}=4\times\alpha\times I_{DAC} \quad \text{[Equation 3]}$$

Where α is 0.5, 0.25, 0.125, 0.0625, and the output current $I_{CO}$ has a current output range that is at most 2 times the current output range of the $I_{DAC}$ according to a value of α by the [Equation 3]. A final output terminal of a data driving IC sinks the output current $I_{CO}$, and the output current $I_{CO}$ is supplied from a high voltage power supply source of an AMOLED panel.

Figure 18A:
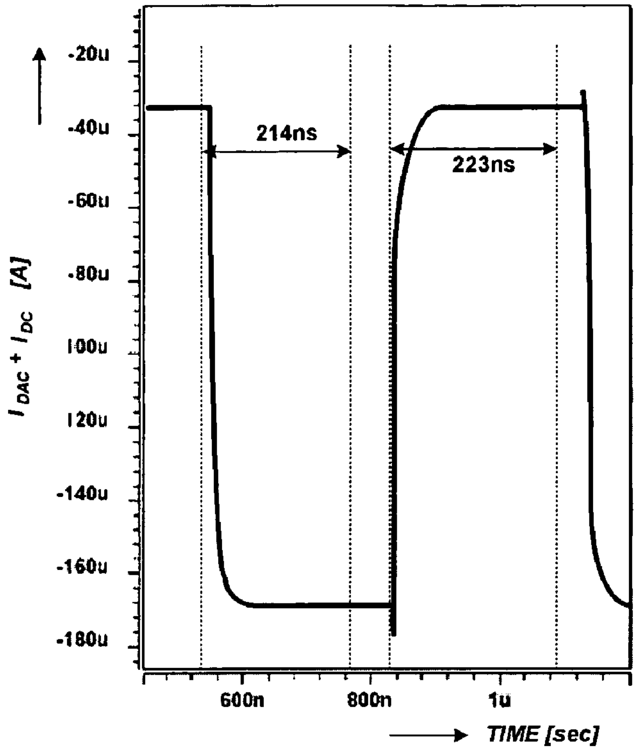
FIG. 18A and FIG. 18B illustrate settling waveforms of a current signal $I_{DAC}$ when an $I_{DC}$ carrier block is included in the current output terminal of the driver and when the $I_{DC}$ carrier block is not included therein, respectively.
Figure 18B:
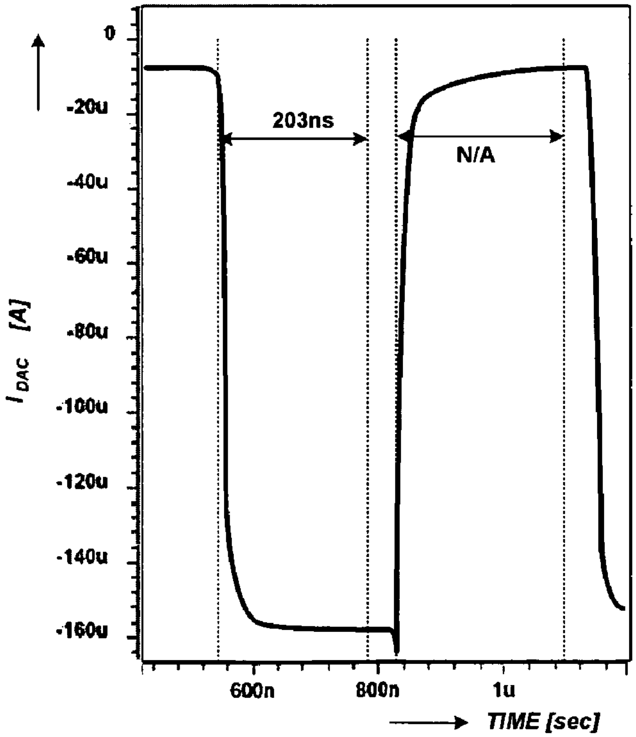

FIG. 18A and FIG. 18B illustrate settling waveforms of a current signal $I_{DAC}$ when an $I_{DC}$ carrier block 383 is included in the current output terminal of the driver and when the $I_{DC}$ carrier block 383 is not included therein. They show the settling waveform of the $I_{DAC}$ current signal from the DACs 370*a*, 370*b* to the current output terminals 380*a* and 380*b*.

A settling time taken for programming output currents $I_{DAC}$ of the DACs 370*a*, 370*b* transmitted to the current output terminals 380*a*, 380*b* needs to be verified. A desired settling time is 328 ns to drive a WXGA resolution panel with scan rate of 60 Hz. However, 50 current output terminals 380*a*, 380*b* share a current output of one DAC 370*a*, 370*b*.

Channel pitches of the current output terminals 380*a*, 380*b* are set to be 52 μm, and red, green, blue are iteratively arranged in current output terminals 380*a* and 380*b*, and thus a maximum length of a $I_{DAC}$ signal wire connected to each current output terminal is 7800 μm (3×50×52 μm). Therefore, the load of the $I_{DAC}$ signal wire needs to be considered to verify the settling time. As shown in FIG. 18A and FIG. 18B, the settling time becomes within 328 ns when the $I_{DC}$ carrier block 383 is included in the current output terminal, but the settling time in a falling curve of the current $I_{DAC}$ may not be verified when the $I_{DC}$ carrier block is not included in the current output terminal.

As described, the foregoing conventional problems may be solved by using a data driving IC having the 10-bit current mode DACs 370*a*, 370*b* and the current output terminals 380*a*, 380*b*.

The embodiments of the present invention exemplarily describe a light emitting display device, but it should be understood that the present invention is not limited thereto.

According to an embodiment of the present invention, output deviation between a plurality of DACs may be reduced since current output terminals of a plurality of channels may be driven by an output of a single DAC while consuming less power.

In addition, according to an embodiment of the present invention, it is possible to drive a wide display panel while consuming less power because a current output terminal in sampling-holding operations may reserve a charging time for data lines of a panel.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A current output device of a data driving apparatus for sequentially applying data signals to data lines, the data signals corresponding to analog converted output currents, the current output device comprising: an analog output current converter for converting the analog converted output currents to analog output currents comprising a main signal and a sub-signal having a predetermined ratio therebetween; a switch for supplying the analog output currents according to a first control signal; and a current sample/hold circuit for sampling or holding the analog output currents according to a current sample/hold control signal, wherein the analog output currents have the predetermined ratio therebetween such that a load condition is constant and a conversion speed of the analog output currents is not reduced.

2. The current output device of claim 1, wherein the switch selects one of a plurality of current output devices.

3. A current output device of a data driving apparatus for sequentially applying data signals to data lines, the data signals corresponding to analog converted output currents, the current output device comprising: an analog output current converter for converting the analog converted output currents to analog output currents comprising a main signal and a sub-signal having a predetermined ratio therebetween; a switch for supplying the analog output currents-according to a first control signal; and a current sample/hold circuit for sampling or holding the analog output currents according to a current sample/hold control signal, wherein the current sample/hold circuit comprises:

a master current sample/hold circuit for sampling or holding the analog output currents according to a first current sample/hold control signal;

a slave current sample/hold circuit for holding or sampling the analog output currents according to a second current sample/hold control signal; and a multiplexer for selecting at least one of the analog output currents held in the master current sample/hold circuit or the slave current sample/hold circuit according to a current output control signal and for applying the selected analog output current to a corresponding one of the data lines.

4. The current output device of claim 3, wherein the first and second current sample/hold control signals are mutually exclusively supplied such that sampling operations are not concurrently performed in the master and the slave current sample/hold circuits.

5. The current output device of claim 3, wherein one of the master and the slave current sample/hold circuits holds a current value sampled for a previous row line time while the other of the master and the slave current sample/hold circuits samples the analog output currents.

6. The current output device of claim 3, wherein currents outputted from the master and the slave current sample/hold circuits are selectively outputted according to the current output control signal after being amplified to an integer multiple thereof.

7. The current output device of claim 3, wherein the master current sample/hold circuit or the slave current sample/hold circuit comprises a two bit digital/analog converter for controlling an analog output current range such that the analog output current range is proportionally reduced within a maximum analog output current range.

8. The current output device of claim 3, further comprising a current supplier for supplying the analog output currents to the master and the slave current sample/hold circuits after adding a predetermined direct current to the analog output currents.

9. The current output device of claim 8, further comprising a subtractor for subtracting the direct current added by the current supplier from the current outputted by the multiplexer.

10. A data driving apparatus for applying data signals to a plurality of data lines of a display panel, the data driving apparatus comprising:

a multiplexer for sequentially selecting and outputting a plurality of data signals;

a digital/analog converter (DAC) for sequentially converting a plurality of data signals sequentially transmitted from the multiplexer into analog data signals; and a current output unit for applying the data signals converted by the DAC into analog data currents to the data lines, wherein the current output unit comprises:

an analog output current converter for inputting the analog output currents as analog output currents comprising a main signal and a sub-signal having a predetermined ratio therebetween;

a switch for supplying the analog output currents according to a first control signal; and a current sample/hold circuit for sampling or holding the analog output currents according to a current sample/hold control signal.

11. The data driving apparatus of claim 10, wherein the current sample/hold circuit comprises:

a master current sample/hold circuit for sampling or holding the analog output currents according to a first current sample/hold control signal;

a slave current sample/hold circuit for holding or sampling the analog output currents according to a second current sample/hold control signal; and a multiplexer for selecting at least one of the analog output currents held in the master current sample/hold circuit or the slave current sample/hold circuit according to a current output control signal and for applying the selected analog output current to a corresponding one of the data lines.

12. The data driving apparatus of claim 11, wherein a first of the master and the slave current sample/hold circuits holds a current value sampled for a previous row line time when a second of the master and the slave current sample/hold circuits samples the analog output currents.

13. The data driving apparatus of claim 11, wherein currents outputted from the master and the slave current sample/hold circuits are selectively outputted according to the current output control signal after being amplified to an integer multiple thereof.

14. The data driving apparatus of claim 10, wherein the first and second current sample/hold control signals are mutually exclusively supplied such that sampling operations are not concurrently performed in the master and the slave current sample/hold circuits.

15. A light emitting display device comprising:

a display unit having a plurality of scan lines for transmitting selection signals, a plurality of data lines for transmitting data signals, and a plurality of pixels coupled to the plurality of data lines and the plurality of scan lines, a data driver for generating the data signals and for applying the data signals to the data lines, and a scan driver for generating the selection signals and for applying the selection signals to the respective scan lines, wherein the data driver comprises, a multiplexer for sequentially selecting a plurality of data signals and outputting the sequentially selected data signals;

a digital/analog converter (DAC) for sequentially converting a plurality of data signals sequentially transmitted from the multiplexer into analog data signals; and a current output unit for controlling the data signals converted by the DAC to be applied to the data lines, and wherein the current output unit comprises:

an analog output current converter for converting the analog output currents to analog output currents including a main signal and a sub-signal having a predetermined ratio therebetween;

a switch for supplying the analog output currents including the main signal and the sub-signal according to a first control signal; and a current sample/hold circuit for sampling or holding the analog output currents including the main signal and the sub-signal according to a current sample/hold control signal.

16. The light emitting display device of claim 15, wherein the current sample/hold circuit comprises:

a master current sample/hold circuit for sampling-or holding the analog output currents according to a first current sample/hold control signal;

a slave current sample/hold circuit for holding or sampling the analog output currents according to a second current sample/hold control signal; and a multiplexer for selecting the output current held in the master current sample/hold circuit or the slave current sample/hold circuit according to a current output control signal and for applying the selected analog output current to a corresponding one of the data lines.

17. The light emitting display device of claim 16, wherein the first and second current sample/hold control signals are mutually exclusively supplied such that sampling operations are not concurrently performed in the master and the slave current sample/hold circuits.

18. The light emitting display device of claim 16, wherein one of the master and the slave current sample/hold circuits holds a current value sampled for a previous row line time when the other of the master and the slave current sample/hold circuits samples the analog output currents.

19. A light emitting display panel comprising:

a plurality of scan lines for transmitting selection signals;

a plurality of data lines for transmitting data currents;

a plurality of pixels coupled to the scan lines and the data lines;

a scan driver for generating the selection signals and for applying the selection signals to the corresponding scan lines; and a data driver for sequentially converting a sequentially transmitted plurality of data signals into analog data signals, and for controlling a current output unit to sequentially apply the converted data signals to the data lines, wherein the current output unit of the data driver comprises:

an analog output current converter for converting the analog converted output currents to analog output currents including a main signal and a sub-signal having a predetermined ratio therebetween;

a switch for supplying the analog output currents including the main signal and the sub-signal according to a first control signal; and a current sample/hold circuit for sampling or holding the analog output currents including the main signal and the sub-signal according to a current sample/hold control signal.

* * * * *

UNITED STATES PATENT AND TRADEMARK OFFICE

CERTIFICATE OF CORRECTION

PATENT NO. : 7,224,303 B2
APPLICATION NO. : 11/229117
DATED : May 29, 2007
INVENTOR(S) : Kwon It is certified that error appears in the above-identified patent and that said Letters Patent is hereby corrected as shown below:

<u>In the Claims</u>

| | |
|---|---|
| Column 18, line 54, Claim 3 | Delete "currents-according", Insert --currents according-- |
| Column 20, line 54, Claim 16 | Delete "sampling-or", Insert --sampling or-- |

Signed and Sealed this

Fifteenth Day of April, 2008

JON W. DUDAS
*Director of the United States Patent and Trademark Office*